United States Patent
Lee et al.

(10) Patent No.: US 10,296,695 B1
(45) Date of Patent: May 21, 2019

(54) METHOD, SYSTEM, AND COMPUTER PROGRAM PRODUCT FOR IMPLEMENTING TRACK PATTERNS FOR ELECTRONIC CIRCUIT DESIGNS

(71) Applicant: Cadence Design Systems, Inc., San Jose, CA (US)

(72) Inventors: Yinnie Lee, Campbell, CA (US); Jeffrey Markham, San Jose, CA (US); Roland Ruehl, San Carlos, CA (US); Karun Sharma, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 382 days.

(21) Appl. No.: 14/292,067

(22) Filed: May 30, 2014

Related U.S. Application Data

(60) Provisional application No. 61/973,226, filed on Mar. 31, 2014.

(51) Int. Cl.
*G06F 17/50* (2006.01)

(52) U.S. Cl.
CPC ...... *G06F 17/5077* (2013.01); *G06F 2217/08* (2013.01)

(58) Field of Classification Search
CPC .......................... G06F 17/5077; G06F 2217/08
USPC ......................................................... 716/129
See application file for complete search history.

(56) References Cited

U.S. PATENT DOCUMENTS

| | | | |
|---|---|---|---|
| 5,598,343 A | 1/1997 | Roy | |
| 5,793,643 A | 8/1998 | Cal | |
| 6,230,304 B1 * | 5/2001 | Groeneveld | G06F 17/505 716/113 |
| 6,664,638 B2 * | 12/2003 | Ushiyama | G06F 17/5077 174/261 |
| 7,191,425 B1 | 3/2007 | Malik | |
| 7,308,669 B2 | 12/2007 | Buehler | |
| 7,378,195 B2 | 5/2008 | Graur | |
| 8,219,939 B2 | 7/2012 | Schultz | |

(Continued)

OTHER PUBLICATIONS

Non-Final Office Action dated May 28, 2015 for U.S. Appl. No. 14/292,166.

(Continued)

*Primary Examiner* — Jack Chiang
*Assistant Examiner* — Brandon Bowers
(74) *Attorney, Agent, or Firm* — Vista IP Law Group, LLP

(57) ABSTRACT

Methods and systems for implementing track pattern for electronic designs are disclosed. The method identifies a first track in a design and viable implementing options for the first track. When adding a second track to the track pattern, the method determines whether the second track corresponds to the viable implementing options for the track. The second track is inserted to the track pattern and situated immediately adjacent to the first track if the second track is determined to correspond to a viable implementing option for the first track. One or more intermediate tracks may be inserted immediately adjacent to the first track before inserting the second track to produce a legal track pattern. Tracks may be removed from a track pattern. One or more intermediate tracks may be inserted into the space occupied by a track being removed to ensure track pattern's compliance with design rules after the track removal.

20 Claims, 22 Drawing Sheets

(56) References Cited

U.S. PATENT DOCUMENTS

| | | | |
|---|---|---|---|
| 8,225,239 | B2 | 7/2012 | Reed et al. |
| 8,316,326 | B1 | 11/2012 | Pierrat |
| 8,418,111 | B2 | 4/2013 | Chen |
| 8,448,102 | B2 | 5/2013 | Kornachuk |
| 8,494,760 | B2 | 7/2013 | Yoel |
| 8,510,702 | B2 * | 8/2013 | Bosshart ............ G06F 17/5077 716/128 |
| 8,607,183 | B2 | 12/2013 | Miezner |
| 8,701,056 | B1 | 4/2014 | Friedberg |
| 8,707,223 | B2 | 4/2014 | Blatchford |
| 8,739,095 | B2 | 5/2014 | Cao et al. |
| 8,782,570 | B1 | 7/2014 | Li |
| 8,799,835 | B2 | 8/2014 | Bendicksen et al. |
| 8,843,867 | B2 | 9/2014 | Chase |
| 8,871,104 | B2 | 10/2014 | Park |
| 8,898,614 | B2 | 11/2014 | Sharma |
| 8,918,745 | B2 | 12/2014 | Wang |
| 8,949,760 | B2 | 2/2015 | Birch et al. |
| 8,954,913 | B1 | 2/2015 | Yuan |
| 8,959,466 | B1 | 2/2015 | Hsu et al. |
| 8,984,465 | B1 | 3/2015 | Salowe |
| 9,003,349 | B1 | 4/2015 | Salowe |
| 9,117,052 | B1 | 8/2015 | Salowe et al. |
| 9,141,751 | B2 | 9/2015 | Lee |
| 9,158,883 | B2 | 10/2015 | Peng |
| 9,158,885 | B1 | 10/2015 | Gray |
| 9,245,082 | B2 | 1/2016 | Birch |
| 9,251,299 | B1 | 2/2016 | Salowe |
| 9,335,624 | B2 | 5/2016 | Lee |
| 9,372,952 | B1 * | 6/2016 | Sun ..................... G06F 17/5077 |
| 9,372,955 | B1 | 6/2016 | Lee et al. |
| 9,396,301 | B1 | 7/2016 | Lee et al. |
| 9,652,579 | B1 | 5/2017 | Arkhipov |
| 9,659,138 | B1 | 5/2017 | Powell |
| 2002/0069396 | A1 | 6/2002 | Bhattacharya |
| 2003/0005399 | A1 | 1/2003 | Igarashi |
| 2008/0028352 | A1 | 1/2008 | Birch et al. |
| 2011/0014786 | A1 | 1/2011 | Sezginer |
| 2014/0040847 | A1 | 2/2014 | Milinichik |
| 2014/0145342 | A1 | 5/2014 | Schultz et al. |
| 2015/0234974 | A1 | 8/2015 | Dechene |

OTHER PUBLICATIONS

Final Office Action dated Oct. 28, 2015 for U.S. Appl. No. 14/292,166.
Notice of Allowance dated Feb. 8, 2015 for U.S. Appl. No. 14/292,122.
Notice of Allowance dated Mar. 15, 2016 for U.S. Appl. No. 14/292,166.
Non-Final Office Action dated Mar. 21, 2016 for U.S. Appl. No. 14/318,488.
Notice of Allowance dated Sep. 21, 2016 for U.S. Appl. No. 14/318,488.
Final Office Action dated Oct. 27, 2016 for U.S. Appl. No. 14/231,688.
Non-Final Office Action dated Mar. 29, 2016 for U.S. Appl. No. 14/231,688.
Non-Final Office Action dated Jul. 28, 2016 for U.S. Appl. No. 14/675,426.
Notice of Allowance dated Jan. 11, 2017 for U.S. Appl. No. 14/675,426.
Non-Final Office Action dated Feb. 27, 2017 for U.S. Appl. No. 14/675,516.
Ex-parte Quayle Action dated Jan. 27, 2017 for U.S. Appl. No. 14/675,609.
Notice of Allowance dated Oct. 10, 2017 for U.S. Appl. No. 14/675,516.
Non-Final Office Action dated Mar. 9, 2017 for U.S. Appl. No. 14/231,688.
Supplemental Notice of Allowance dated Apr. 21, 2017 for U.S. Appl. No. 14/675,609.
Final Office Action dated Jun. 16, 2017 for U.S. Appl. No. 14/675,516.
Final Office Action dated Jun. 30, 2017 for U.S. Appl. No. 14/231,688.
Non-Final Office Action dated Nov. 16, 2017 for U.S. Appl. No. 14/231,688.
Final Office Action dated Mar. 26, 2018 for U.S. Appl. No. 14/231,688.

* cited by examiner

| Widths | Widths + MinSpacing | Period = 1000 max(ai) | Size of Combinatorial Space |
|---|---|---|---|
| 32 | 56 | 17 | 17 |
| 34 | 58 | 17 | 289 |
| 38 | 62 | 16 | 4624 |
| 40 | 64 | 15 | 69360 |
| 46 | 70 | 14 | 971040 |
| 58 | 82 | 12 | 11652480 |
| 62 | 86 | 11 | 128177280 |
| 70 | 94 | 10 | 1281772800 |
| 76 | 100 | 10 | 12817728000 |
| 78 | 102 | 9 | 115359552000 |
| 86 | 110 | 9 | 1038235968000 |

FIG. 9B

METHOD, SYSTEM, AND COMPUTER PROGRAM PRODUCT FOR IMPLEMENTING TRACK PATTERNS FOR ELECTRONIC CIRCUIT DESIGNS

CROSS REFERENCE TO RELATED APPLICATION(S)

This application claims the benefit of U.S. provisional patent application Ser. No. 61/973,226 entitled "METHOD, SYSTEM, AND COMPUTER PROGRAM PRODUCT FOR IMPLEMENTING TRACK PATTERNS FOR ELECTRONIC CIRCUIT DESIGNS" and filed on Mar. 31, 2014. The entire content of the aforementioned U.S. provisional patent application is hereby expressly incorporated by reference for all purposes.

This application is related to U.S. patent application Ser. No. 14/231,688 entitled "METHOD, SYSTEM, AND COMPUTER PROGRAM PRODUCT FOR IMPLEMENTING TRACK PATTERN SYNTHESIS FOR ELECTRONIC CIRCUIT DESIGNS" and filed on Mar. 31, 2014, U.S. patent application Ser. No. 14/292,122 entitled "METHOD, SYSTEM, AND COMPUTER PROGRAM PRODUCT FOR IMPLEMENTING REPETITIVE TRACK PATTERNS FOR ELECTRONIC CIRCUIT DESIGNS", and U.S. patent application Ser. No. 14/292,166 entitled "METHOD, SYSTEM, AND COMPUTER PROGRAM PRODUCT FOR INTERCONNECTING CIRCUIT COMPONENTS WITH TRACK PATTERNS FOR ELECTRONIC CIRCUIT DESIGNS". The content of the aforementioned U.S. patent applications is hereby expressly incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

In an effort to deal with and simplify otherwise extremely complex design rules at advanced process rules, foundries are now turning to a different approach in which routing regions of a design on any particular metal layer are performed only on a set of specific metal tracks, each of which may only take on width values from a discrete set of legal widths that may be made available in the process Design Rule Manual (DRM). Furthermore, in order to facilitate self-aligned double patterning (SADP) processes and deal with mask designation issues, additional constraints may be created by which track widths may be selected. For example, after a first track is chosen and assigned a photomask color or photomask designation (e.g. B for Blue), the next track may need to be assigned a different photomask color or photomask designation (e.g., C for Cyan), and may only take one of a discrete set of legal width values, where that set in turn is a function of the preceding B track width.

An electronic design may correspond to and thus include more than ten different size wires, and the tracks for the electronic design may thus be associated with as many legal widths. Any attempt to manually figure out which track associated with a given width may be immediately neighboring another track associated with a given width is nearly impossible due to the sheer number of different possible legal combinations of tracks, especially in light of the extremely complex design rules that govern what track patterns are legal. Therefore, generating a legal track pattern including a plurality of tracks associated with some legal widths is nearly impossible to be performed manually, especially when an electronic design includes more than a few legal or permissible widths.

Therefore, there exists a need for effective and efficient techniques to implement track pattern for electronic circuit designs.

SUMMARY

Disclosed are method(s), system(s), and article(s) of manufacture for implementing track pattern for electronic circuit designs in one or more embodiments. Some embodiments are directed at a method for implementing track pattern for electronic circuit designs. These method may use a computer to execute a sequence of instructions to perform a process that identifies a first track in a region within an electronic design. The method further identifies a second track that is to be arranged or implemented adjacent to the first track within the region.

Before the method arranges or implements the second track at or near a location adjacent to the first track, the method determines whether or not the second track corresponds to a set of one or more viable implementing options for the first track. The method may create or update the track pattern by inserting the second track immediately adjacent to the first track when the second track is determined to correspond to a viable implementing option for the first track. One or more intermediate tracks may be added at or near the location immediately adjacent to the first track before inserting the second track to the track pattern when the second track is determined not to correspond to a viable implementing option for the first track.

Some embodiments are directed at a hardware module or system that may be invoked to perform any of the methods, processes, or sub-processes disclosed herein. The hardware system may include a track pattern processing module, a track pattern database enumeration and maintenance module, an implementing option processing module, a track pattern generation module, and/or a track pattern evaluation module in some embodiments. The hardware system may further include one or more forms of non-transitory machine-readable storage media or devices to temporarily or persistently store various types of data or information such as the firmware. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for implementing track patterns for electronic circuit designs are described below with reference to FIGS. 1-14.

BRIEF DESCRIPTION OF THE DRAWINGS

The drawings illustrate the design and utility of various embodiments of the invention. It should be noted that the figures are not drawn to scale and that elements of similar structures or functions are represented by reference numerals throughout the figures. In order to better appreciate how to obtain the above-recited and other advantages and objects of various embodiments of the invention, a more detailed description of various embodiments briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 8A-1 and 8A-2 illustrate a scenario where two wire segments and are spaced at a distance that is different from and thus violates the constant spacing rule in some embodiments.

FIG. 9B illustrates various sizes of the combinatorial space with different number of widths in some embodiments.

DETAILED DESCRIPTION

Various embodiments of the invention are directed to a methods, systems, and articles of manufacture for implementing track patterns for electronic circuit designs. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of various embodiments described herein. Where certain elements of some embodiments may be partially or fully implemented using known components (or methods or processes), only those portions of such known components (or methods or processes) that are necessary for an understanding of various described embodiments will be described, and the detailed descriptions of other portions of such known components (or methods or processes) will be omitted so as not to obscure the invention. Further, various embodiments encompass present and future known equivalents to the components referred to herein by way of illustration.

Disclosed are method(s), system(s), and article(s) of manufacture for implementing track patterns for electronic circuit designs in one or more embodiments.

Figure 1:
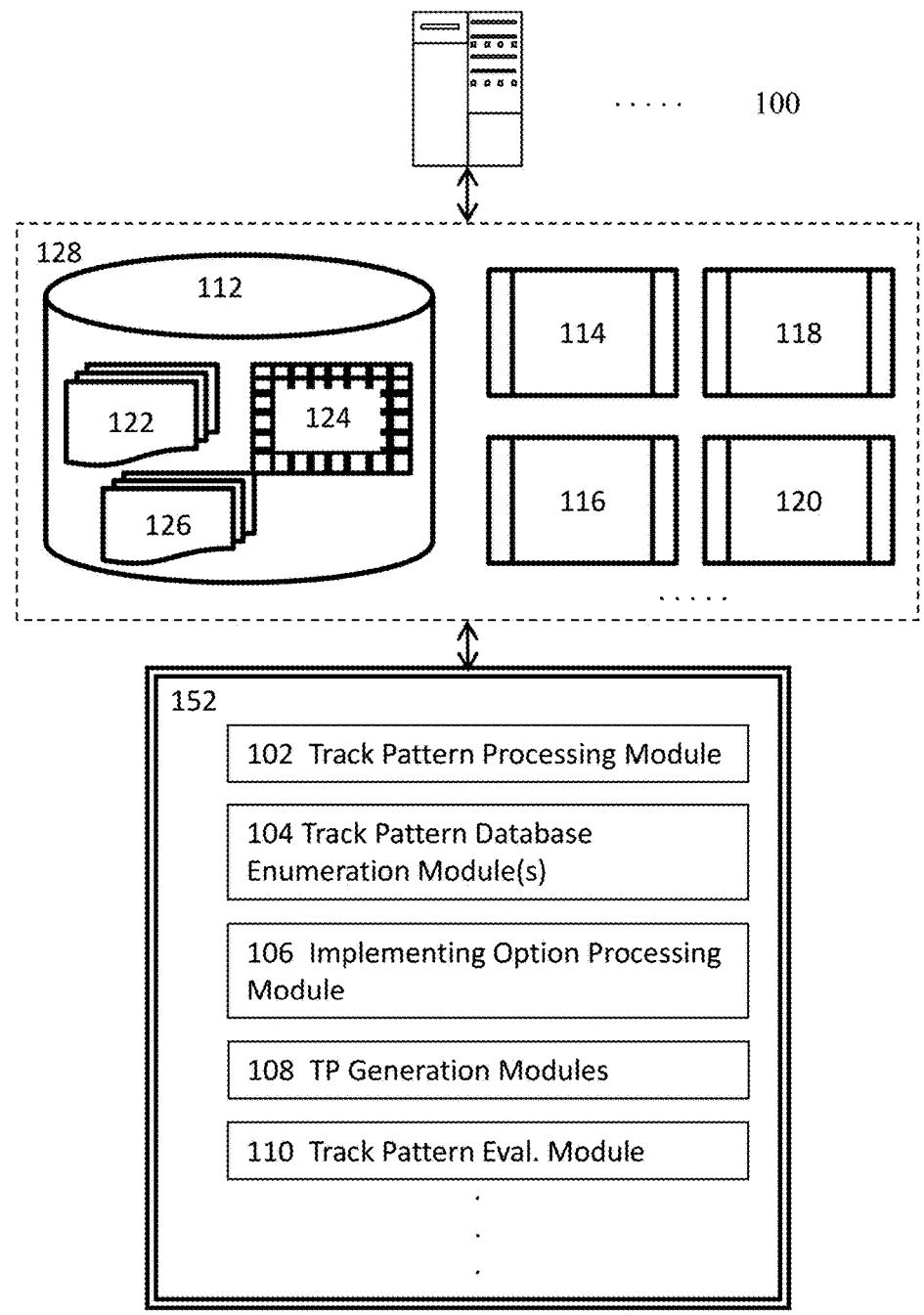
FIG. 1 illustrates an illustrative high level schematic block diagrams for a system for implementing track patterns for electronic circuit designs in some embodiments.

FIG. 1 illustrates an illustrative high level schematic block diagrams for implementing track patterns for electronic designs. In one or more embodiments, FIG. 1 illustrates an illustrative high level schematic block diagrams for implementing track patterns for electronic designs and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a floorplanner, a global routing engine, and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), electronic circuit design specification database(s), various statistics, various data, rule decks, various design rules, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises one or more track pattern processing modules 102 to insert, remove, modify, improve, optimize, or otherwise operate upon tracks or routing tracks in track patterns, one or more track pattern database enumeration and maintenance modules 104 to enumerate, determine, or update legal track pattern database(s) to generate viable implementing options for track associated with various widths, one or more implementing option processing modules 106 to identify, determine, modify, or rank viable implementing options for various tracks and/or track patterns, one or more track pattern generation and prediction modules 108 to generate, update, modify, or otherwise perform various operations on track patterns and/or to forward predict subsequent additions of tracks into a track pattern, and one or more track pattern evaluation modules 110 to evaluate track patterns against various design rules, performance objectives, manufacturing requirements, or other constraints.

A routing track or simply a track (hereinafter a "track") includes a one-dimensional fictitious line or line segment derived from the manufacturing grids provided by foundries. A routing track thus having zero width in physical designs (e.g., a layout of an electronic design) and is used to guide physical implementation tools (e.g., floorplanner, placement tools, or routing tools) to implement the physical design for an electronic design. For example, a routing tool may lay the centerline of a wire segment along a routing track during the routing process. A routing track may nonetheless be associated with a width to indicate that the particular routing track is to be used to route wires having the associated width. In this application, some routing tracks may be illustrated as rectangular shapes to indicate that such routing tracks are associated with the widths as shown in various figures. Nonetheless, the rectangular representations of such routing tracks are not intended to explicitly, implicitly, or inherently indicate that routing tracks have two-dimensional geometrical structures or shapes.

Figure 2:
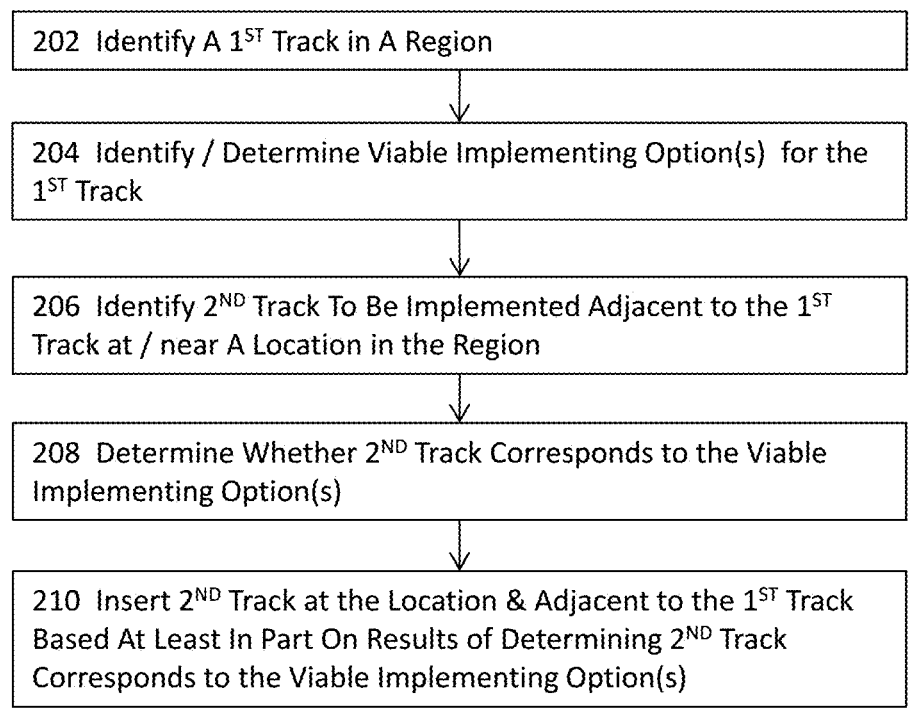
FIG. 2 illustrates a high level block diagram for a method or system for implementing track patterns for electronic circuit designs in some embodiments.

FIG. 2 illustrates a high level block diagram for a method or system for implementing track patterns for electronic circuit designs in some embodiments. In these embodiments illustrated in FIG. 2, the method or system may first identify a first track in a region of an electronic design. A region may include a cell, a block, an arbitrary area (e.g., a windowed area in a layout editor) in an electronic design, or an instance thereof. A track or a routing track (collectively a "track") includes a fictitious line or line segment that has zero thickness and is used to guide a physical design implementation tool (e.g., a floorplanner, a placement tool, or a routing tool) to implement the physical design of an electronic design.

For example, a routing tool may implement a wire segment by placing the centerline of the wire along a track. Tracks Although a track has no thickness, a track may nevertheless be associated with a width value which represents the width of a wire or interconnect implemented along the track. Therefore, a track may be graphically represented as a line or a two-dimensional rectangular strip. Nonetheless, the rectangular representation of a track does not explicitly, implicitly, or inherently indicate that a track has a non-zero width value. A track pattern includes a collection of one or more tracks running in parallel and arranged in a certain sequence or order.

Certain design rules may regulate which tracks associated with certain widths may be situated immediately adjacent to another track associated with a width. For example, a design rule may require that only tracks associated with a width greater than or equal to 58-nm may be situated immediately adjacent to another track associated with 46-nm width. Therefore, a track pattern is considered legal if the tracks in the track pattern are arranged in an order that fully complies with the design rules governing legality of track arrangement. As a result of such limitation on the arrangement of tracks, the method or system may determine one or more viable implementing options for the first track at 204.

A viable implementing option for a first track includes a second track that may be legally arranged immediately adjacent to the first track according to one or more design rules. In some embodiments, the method or system may look up the one or more viable implementing options in a database including a collection of various legal track patterns. In some other embodiments, the method or system may identify or determine the one or more viable implementing options by examining one or more matrices (e.g., the matrices graphically illustrated in FIGS. 10 and 10A) and identifying these one or more viable implementing options for the next track at 204.

At 206, the method or system may identify a second track that is to be situated at or near a location and arranged adjacent (immediately adjacent or with one or more intervening tracks) to the first track in the region. The location may be identified in a variety of ways. For example, the method or system may receive a user's input for the exact coordinates of the location via a computer keyboard or for an approximate location on a display apparatus via a computer pointing device. The method or system may also identify the location via a file or data structure that includes the area in which one or more tracks or track patterns are desired or required. The method or system may determine whether the second track belongs to the one or more implementing options at 208.

Figure 10:
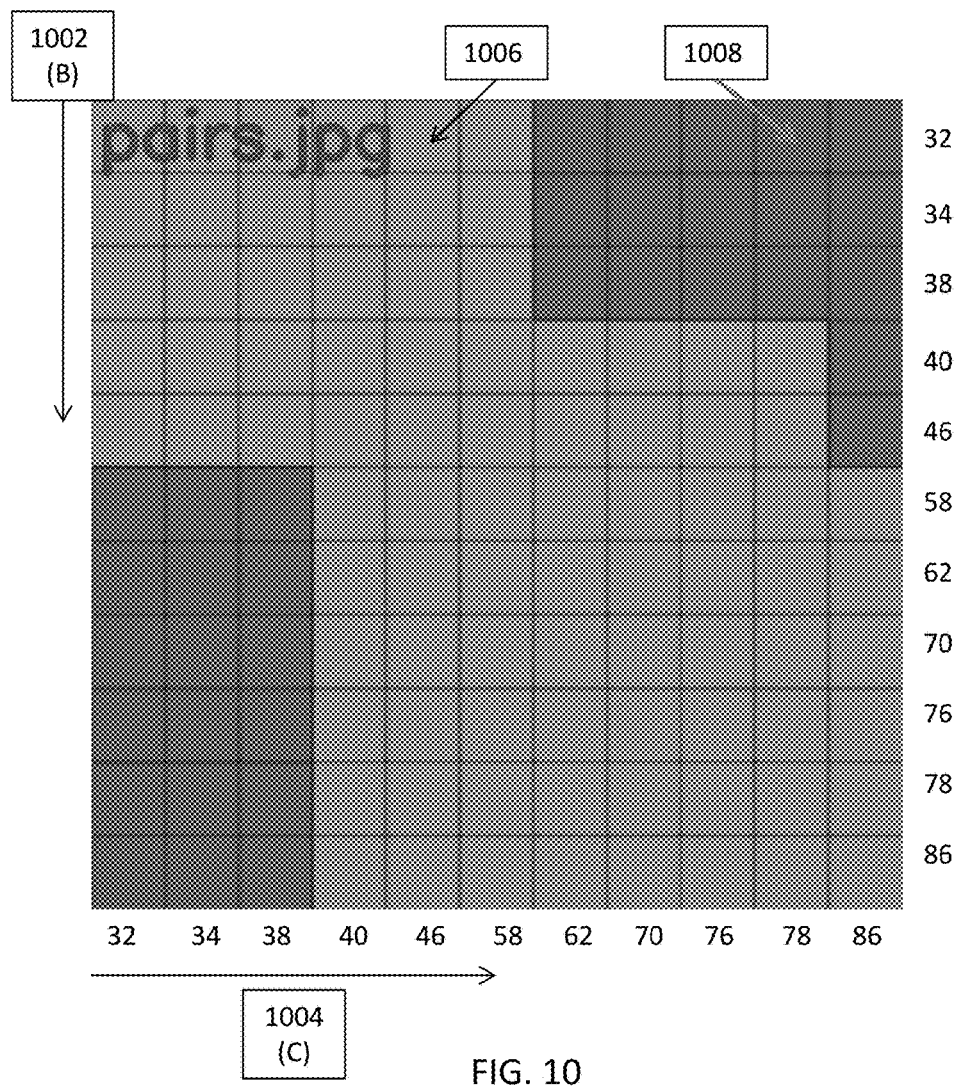
FIG. 10 illustrates legal and illegal combinations of two adjacent tracks associated with two permitted widths in some embodiments.

For example, the method or system may examine a pair-matrix (e.g., a graphical representation of the pair-matrix shown in FIG. 10) that governs which two-track combinations are legal and determine whether or not the second track belongs to the one or more viable implementing options. In the alternative, the method may further consult a database including various legal track patterns to determine whether the two-track pattern—first track-second track—is a legal track pattern.

In some embodiments where the designer has the authority to determine which second track is to be used, the designer may simply identify a viable implementing option identified at 204 for the second track. Oftentimes, a customer or foundry may require a specific track pattern with a specific sequence of tracks associated with particular widths. In this latter case, the designer may be bound by such requirements from the customer or foundry. Therefore, upon the identification of the second track at 206, the method or system may determine whether or not the second track is a viable implementing option to be arranged immediately adjacent to the first track.

At 210, the method or system may insert or arrange the second track adjacent to the first track based at least in part upon a determination of whether or not the second track belongs to the one or more implementing options for the first track. For example, the method or system may identify an approximate location for a second track from a user's input via a computer pointing device at 202. The method or system may then identify the second track to be arranged at the approximate location adjacent to the first track. The method or system may nevertheless determines that the second track is not a viable implementing option for the first track at 210 but still need to insert a second track at the approximate or exact location adjacent to the first track.

The method or system cannot however simply fulfill the track pattern having the first track and then the second track at 210 while ignoring the one or more design rules that render arranging the second track adjacent to the first track illegal. In some embodiments, the method or system may insert one or more intermediate tracks in the space between the first track and the second track such that the design now includes the required first track and the second track while complying with the design rules governing legality of track patterns. More details about the insertion of intermediate tracks will be described in subsequent paragraphs with reference to FIGS. 3 and 4A-B below.

Figure 3:
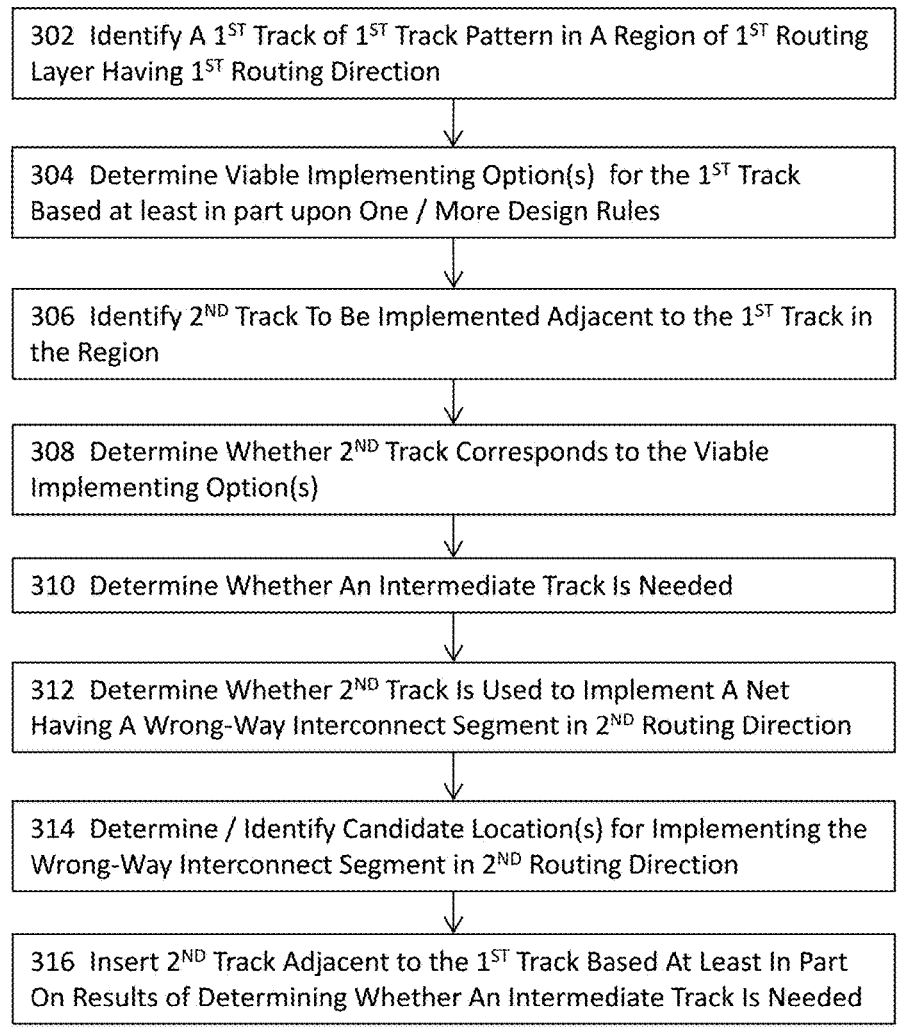
FIG. 3 illustrates a more detailed level flow diagram for a method or system for implementing track patterns for electronic circuit designs in some embodiments.

FIG. 3 illustrates a more detailed level flow diagram for a method or system for implementing track patterns for electronic circuit designs in some embodiments. In these embodiments illustrated in FIG. 3, the method or system may identify a first track of a first track pattern in a region of a first routing layer having a first routing direction at 302. In some embodiments, a routing layer may permit only one routing direction, whereas a routing layer may permit two different routing directions (e.g., right-way routing direction and wrong-way routing direction) such that wrong-way routing is permitted on this routing layer in some other embodiments.

At 304, the method or system may identify or determine one or more viable implementing options for the first track based at least in part upon one or more design rules in identical or substantially similar manners as those described for 204 of FIG. 2. The one or more design rules include, for example but not limited to, a minimum spacing design rule governing the minimum spacing between two adjacent wires, design rules governing which tracks associate with associated with certain widths may be situated immediately adjacent to another track associated with a width (e.g., pair rules or BC rules where B stands for blue and C stands for cyan in double patterning governing which two-width combinations are legal or triplet rule or BCB rule governing which three-width combinations are legal, etc.), one or more other design rules such as a minimum length rule governing the minimum length required for an interconnect segment, a same track line-end design rule, a different track line-end design rule, a keep-out design rule, etc. It shall be noted that the terms "blue" and "cyan" are used in this application to indicate two different photomask designations, and that these two terms are not intended to and shall not be interpreted to limit the scope of various embodiments described herein or the scope of the claims. Any other graphical, textual, or symbolic (e.g., pointers, link structures, etc.) designations that distinguish one photomask from another photomask may therefore be used to achieve identical or substantially similar purposes described here.

In the aforementioned BC-rule naming nomenclature, B stands for Blue and the wire segments associated with the B designation are produced by the mandrel mask in an NSADP (negative self-aligned double pattern) process. Some of these design rules will be described in greater details in subsequent paragraphs with reference to FIGS. 8A-I below. At 306, the method or system may identify a second track to be implemented either immediately adjacent to the first track or adjacent to the first track with one or more intervening tracks between the first track and the second track in identical or substantially similar manners as those described for 206 of FIG. 2.

At 308, the method or system may determine whether or not the second track belongs to the one or more viable implementing options identified or determined at 304. At 310, the method may further determine whether one or more intermediate tracks are needed between the first track and the second track to render the track pattern including the first track and the adjacent second track legal as governed by one or more design rules controlling legal combinations of tracks associated with various widths. For example, the method or system may consult the database or various matrices (e.g., the matrices graphically illustrated in FIGS. 10 and 10A) including various legal track patterns having various tracks associated with respective widths and arranged in various sequences to determine whether one or more intermediate tracks or dummy tracks may be needed to transition from the first track associated with a first width to the second track associated with a second width.

As a practical example where the first track and the second track are respectively associated with 34-nm and 76-nm width as referenced in FIG. 10, this combination of widths renders the track pattern including the first track and the immediately neighboring second track illegal. Therefore, the method or system may thus determine that one or more intermediate tracks may be needed between the first track and the second track. At 312, the method or system may further optionally determine whether the second track is to be used to implement a net having at least one wire segment in the second routing direction.

If the determination is affirmative, the method or system may identify or determine one or more candidate locations for implementing the wrong-way wire segment in the second routing direction at 314. In some of the embodiments illustrated in FIG. 3, the method or system may make such identification or determination based at least in part upon a user's input for inserting a via or a bend (e.g., through selection of a menu item or via clicking at a location that indicate a bend or a via may be needed). The method or system may insert the second track either immediately adjacent to or with one or more intervening tracks from the first track at 316.

Figure 7:
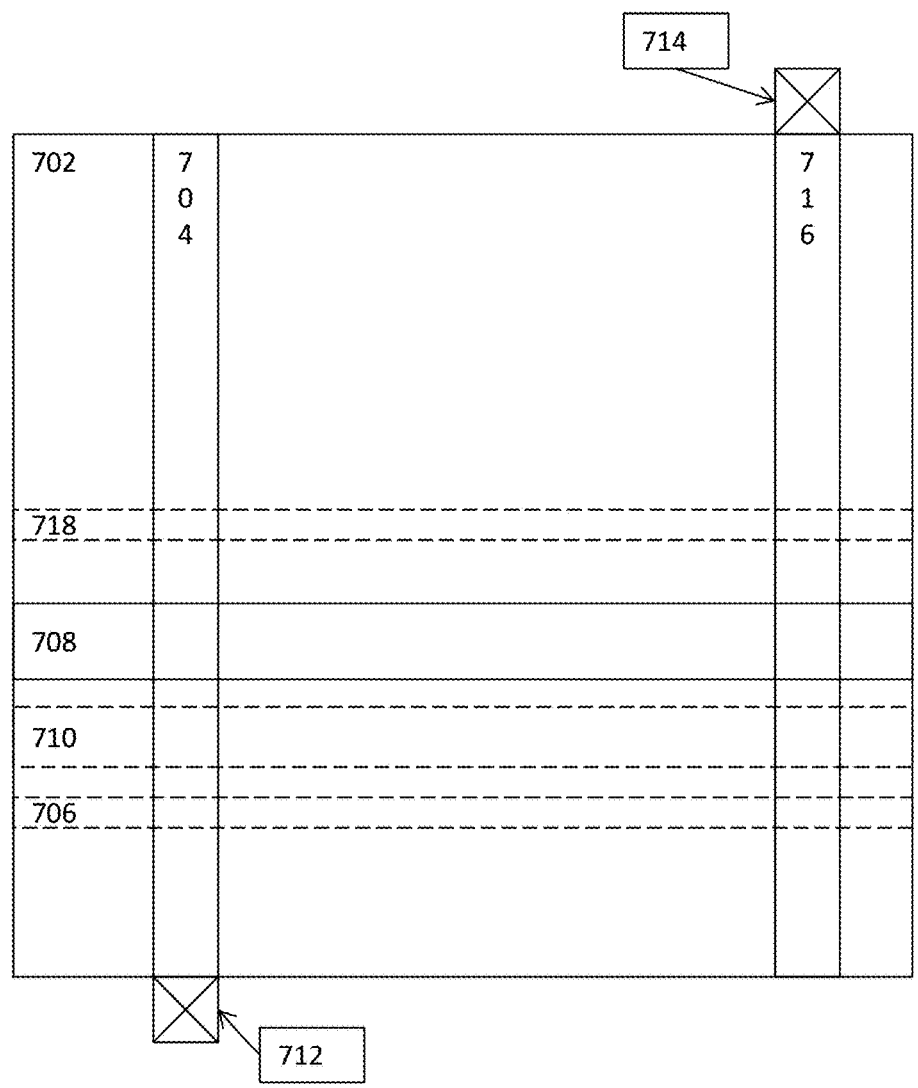
FIG. 7 illustrates an illustrative portion of a simplified electronic design to which a method or system for implementing track patterns applies in some embodiments.

For example, FIG. 7 illustrates an illustrative region 702 of an electronic design where an interconnection between the source pin 712 and the destination pin 714 is to be constructed. It is assumed that track 706 in the first routing direction already exists in the design and represents the first track identified at 302, and tracks 704 and 716 in the second routing direction are to be used to implement the interconnection from the source pin 712 to the destination pin 716. The horizontal segment of the interconnection needs to satisfy some width requirement. For example, the horizontal segment needs to have a width that is the smaller width of the width of the vertical wire segment along track 704 and the vertical wire segment along track 716.

Although the existing track 706 in the first direction appears to have the correct orientation, track 706 is nevertheless associated with a smaller width value that does not satisfy the aforementioned width requirement. Therefore, the method or system is to identify and insert another track to finish the interconnection. It is further assumed that the input location for the horizontal interconnection identified at 302 is to near where track 706 is situated in FIG. 7. As a result, the method or system is to identify a second track that is situated adjacent to track 706. With the presence of track 706 having a small width value, not all widths may be associated with the second track as required by the design rules (e.g., the pair design rules).

For example, a design rule may prohibit having a first wire having a small width from be arranged right next to a second wire having a large width. Assuming the first track 706 is associated with a 32-nm width, and tracks 704 and 716 are associated with 76-nm and 86-nm respectively. Therefore, the minimum width associated with the second track 708 will be 76-nm (the smaller of 76-nm and 86-nm). As the illustrative FIG. 10 shows, 32-nm width represents the first row along 1002, and 76-nm represents the ninth column in FIG. 10. The box (1, 9) nevertheless belongs to the prohibited combinations 1008 illustrated in darker shaded areas. Therefore, the method or system may thus determine that at least one intermediate track is needed between the first track associated with 32-nm width and the second track associated with at least 76-nm width.

The method may thus insert the second track 708 at or near the location identified at 302 and insert, for example, a third track 710 that is associated with 46-nm width and is situated between the first track 706 and the second track 708 at 316, while satisfying the spacing requirements. In this example, only one intermediate track 710 is inserted to render the track pattern including the first track 706 followed by the second track 708 legal. Nonetheless, if the location identified at 302 is further distant from the first track 706, the method or system may identify and insert more than one intermediate tracks to render the track pattern legal.

Figure 4:
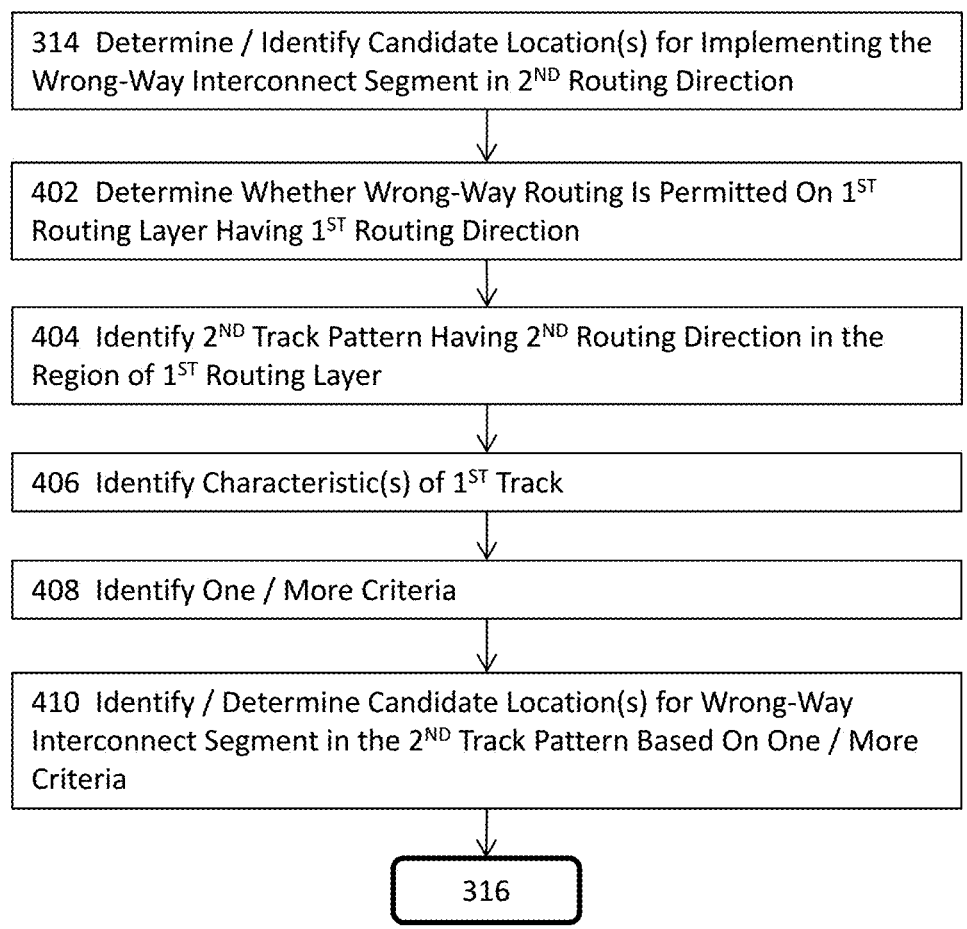
FIG. 4 illustrates a more detailed flow diagram for a process or module for implementing track patterns for electronic circuit designs as illustrated in FIG. 3 in some embodiments.

FIG. 4 illustrates a more detailed flow diagram for a process or module for implementing track patterns for electronic circuit designs as illustrated in FIG. 3 in some embodiments. More specifically, FIG. 4 illustrates a more detailed process or module for reference numeral 314 of FIG. 3. In these embodiments illustrated in FIG. 4, the process or module 314 may determine whether or not wrong-way routing is permitted on the first routing layer having the first routing direction at 402. A routing layer may exhibit a single routing direction where no bends are permitted or may exhibit two routing directions (e.g., two orthogonal or oblique routing directions) where bends are permitted.

In some embodiments where two routing directions are permitted, one of the two routing direction may be referred to as the preferred direction or right-way routing direction, and the other routing direction may be referred to as the wrong-way routing direction. At 404, the process or module 314 may identify a second track pattern having a second routing direction in the region of the first routing layer. In the above example with reference to FIG. 7, the routing direction along the tracks 706, 708, and 710 may be considered the first routing direction, and the routing direction along tracks 704 and 716 may be considered the second routing direction.

At 406, the method or system may identify one or more characteristics of the first track identified at 302. In some embodiments, the one or more characteristics of the first track comprise the width associated with the first track. The process or module 314 may then identify one or more criteria at 408. These one or more criteria may include, for example but not limited to, the widths associated with one or more tracks (e.g., the tracks used in conjunction with the second track to implement the net, etc.), one or more design rules (e.g., a constant spacing design rule, etc.), one or more other neighboring wires or neighboring tracks, or any combinations thereof, etc.

At 410, the process or module 314 may identify or determine the one or more candidate locations for the second track to implement the wrong-way interconnect segment based at least in part upon at least one of the one or more criteria identified at 408. In the aforementioned example with reference to FIG. 7 as described above, the process or module may identify the second track 708 and its associated characteristics (e.g., the associated width) based on the widths of tracks 704 and 716, the location identified at 302, the width of the first track 706, the minimum spacing design rule or the constant spacing design rule, and/or the design rules governing legal combinations of widths in track patterns.

Figure 4A:
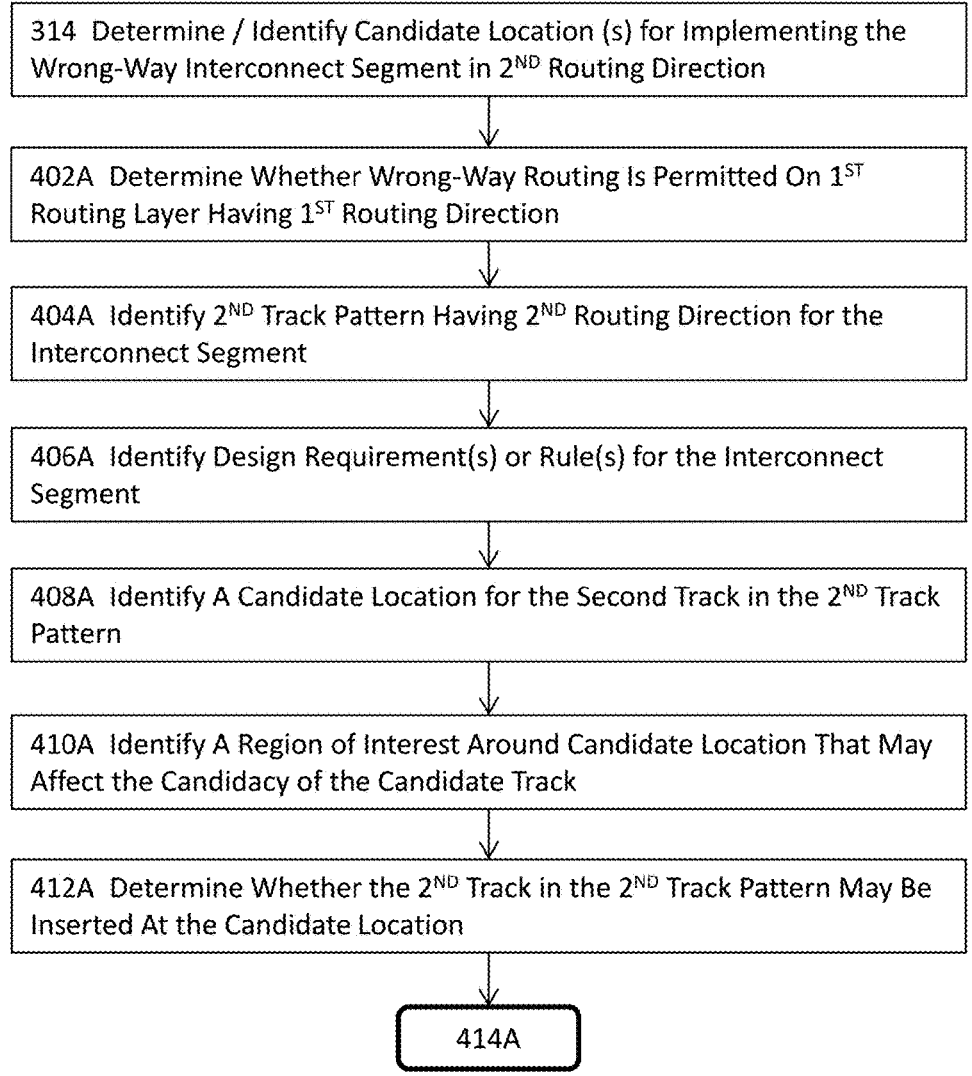
FIGS. 4A-B jointly illustrate a more detailed flow diagram for a process or module for implementing track patterns for electronic circuit designs as illustrated in FIG. 3 in some embodiments.
Figure 4B:
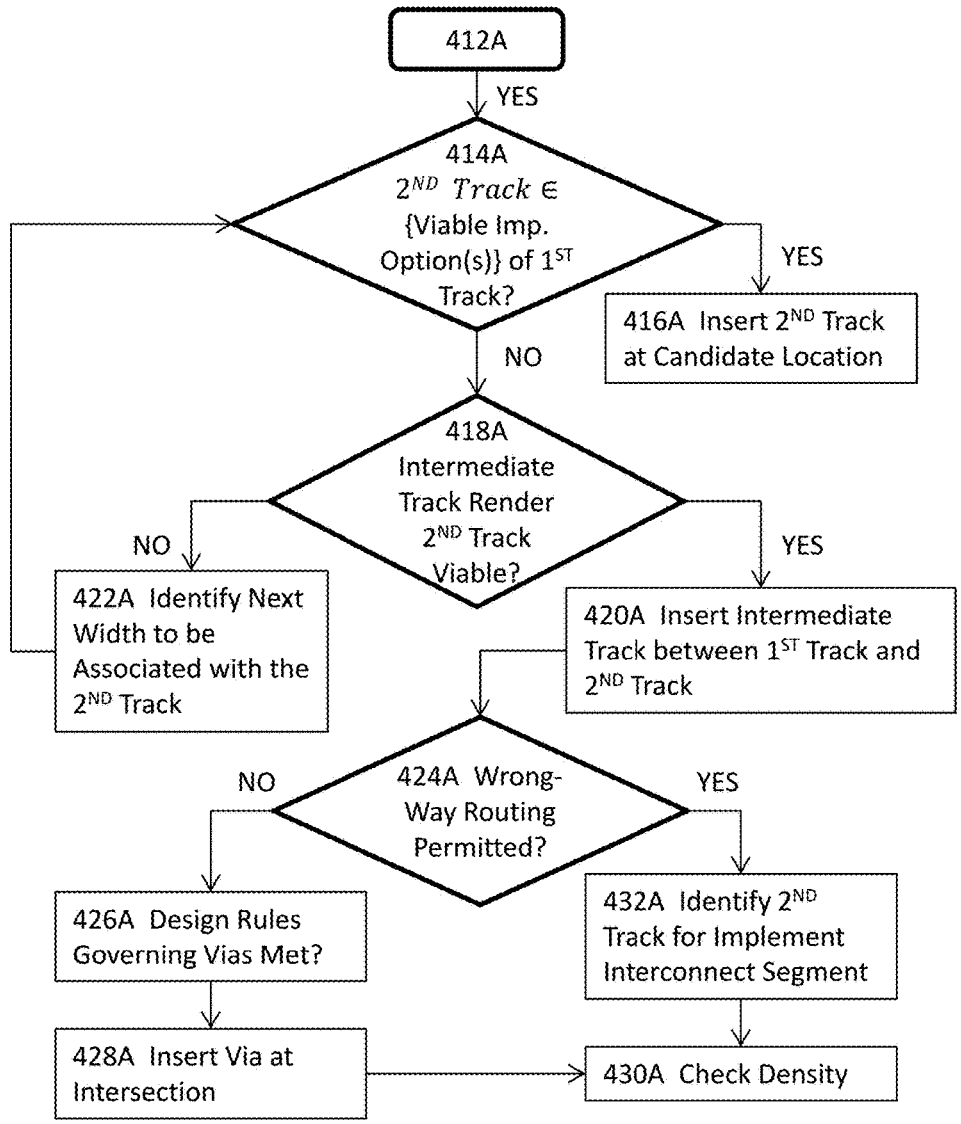

FIGS. 4A-B jointly illustrate a more detailed flow diagram for a process or module for implementing track patterns for electronic circuit designs as illustrated in FIG. 3 in some embodiments. More specifically, FIG. 4 illustrates a more detailed process or module for reference numeral 314 of FIG. 3. In these embodiments illustrated in FIG. 4, the process or module 314 may determine whether or not wrong-way routing is permitted on the first routing layer having the first routing direction at 402A in identical or substantially similar manners as those described for 402 of FIG. 4.

At 404A, the process or module 314 may identify a second track pattern having a second routing direction for implementing the wrong-way interconnect segment. The second track pattern includes the second track identified at 306. That is, the embodiments illustrated in FIGS. 4A-B is to identify or determine whether a particular track (e.g., the second track identified at 306) may be arranged either immediately adjacent to or with intervening intermediate tracks therebetween an existing track in the same, second track pattern. It shall be noted that although these processes and modules are described within the context of implementing track patterns in a wrong-way routing direction.

Substantially similar or even identical processes or modules may also apply to implementing track patterns in a single routing direction. In both cases, a track to be inserted into a design is subject to the same set of design rules governing legal combinations of widths associated with the tracks in track patterns. The difference in implementing track patterns in a single routing direction and in the wrong-way direction is that the wire-way tracks may be further limited by the widths associated with the right-way tracks as described above in FIGS. 3-4 and 4A-B.

The process or module 314 may further identify one or more requirements or one or more design rules for implementing the wrong-way interconnect segment at 406A. The one or more requirements may include, for example but not limited to, the source pin location, the destination pin location, the relative location of the destination pin to the source pin, one or more requirements or constraints on track patterns such as legal width combinations, a requirement of having fewer or minimum number of bends, the minimum length requirement for interconnect segments, the design rules described with reference to FIGS. 8A-I, any combinations thereof, or other appropriate rules, requirements, or constraints, etc.

The process or module may identify a candidate location with the required or desired characteristics (e.g., its associated width, length, etc.) for the wrong-way interconnect segment at 408A and identify a region of interest around the candidate location that may affect the candidacy of the candidate location at 410A. The region may include a cell, a block, an instance of a block or cell, or an arbitrary area (e.g., a windowed area in a layout editor) in an electronic design. A region may affect the candidacy of a track because the region may include one or more tracks near the candidate location, and the one or more tracks may be associated with some widths that may render the arrangement of the second track at the candidate location illegal.

In the example illustrated in FIG. 7, although the addition of track 710 renders the track pattern including track 706 and track 708 legal, track 708 may be rendered illegal due to the presence of another track 718 associated with a small width value. At 412A, the process or module 314 may determine whether a first track of the second track pattern may be inserted at the candidate location identified at 408A. The process or module 314 may then determine whether the identified second track of the second track pattern belongs to a set of viable implementing options of the first track in the same second track pattern at 414A. That is, the process or module 414A determines whether the combination of {the first track-the second track} in the second track pattern is legal as permitted by the design rules.

If the determination result is affirmative, the process or module may proceed to 416A to insert the second track at or near the location identified at 302. The process or module may insert the second track at 416A If the determination result is negative, the process or module 314 may proceed to 418A to further determine whether the addition of one or more intermediate tracks renders the second track a viable implementing option for the first track in the second track pattern, while satisfying one or more design rules. For example, the process or module 314 may determine whether arranging the second track having a specific associated width value at or near the location identified at 302 satisfies, for example, the spacing rule.

If the determination result is affirmative, the process or module 314 may proceed to 420A to insert one or more intermediate tracks between the first track and the second track of the second track pattern in the second routing direction. Otherwise, the process or module 314 may proceed to 422A to identify the next width to be associated with the second track and repeat the determinations from 414A until a viable solution for the second track is identified or determined. For example, there may be multiple legal widths, each of which may be associated with the second track with respect to the existing first track in the second track pattern.

Given the existing first track in the second track pattern, the process or module goes through these legal widths to determine a width to be associated with the second track, while satisfying one or more requirements and/or one or more design rules. In the example illustrated in FIG. 7, a width of 76-nm was selected in the description with reference to FIG. 3. Nonetheless, if associating the 76-nm width with the second track does not render the second track pattern a viable solution for the first track to produce a legal combination of tracks, the process or module 314 may identify another width (e.g., 86-nm) and determine whether or not associating the 86-nm width with the second track will result in a legal combination of tracks, while satisfying one or more design rules such as the minimum spacing rule or the constant spacing rule.

At 424A, the process or module may further determine whether wrong-way routing is permitted on this particular routing layer. Some modern electronic designs may permit only one routing direction and prohibit any bends or wrong-way routing. If the determination result at 424A is negative (e.g., wrong-way routing is prohibited), the process or module 314 may proceed to 426A to further determine whether or not the second track pattern or more specifically an interconnect segment implemented along the second track satisfies one or more design rules governing vias. These one or more design rules may include, for example but not limited to, a via enclosure design, a via cut size rule, etc.

The process or module 314 may then proceed to 428A to insert one or more vias at the intersections of the second track and the tracks interconnecting the source pin and the destination pin in the first routing direction when the one or more design rules are satisfied. If at least one of the one or more design rules is not satisfied, the process or module 314 may adjust the second track to satisfy the one or more design rules. For example, the process or module 314 may insert an intermediate track as a dummy track between the first track and the second track and re-determine whether an interconnect segment implemented along the second track will satisfy these one or more design rules governing via insertion.

The process or module 314 may then optionally proceed to 430A to determine whether or not the metal density design rule or one or more performance requirements or objectives are satisfied. On the other hand, if the determination result at 424A is affirmative (e.g., wrong-way routing is permitted), the process or module 314 may proceed to 432A to identify the second track for implementing the interconnect segment in the wrong-way routing direction and implement the interconnection with one or more bends. The process or module 314 may also optionally proceed to 430A to determine whether or not the metal density design rule or one or more performance requirements or objectives are satisfied.

Figure 5:
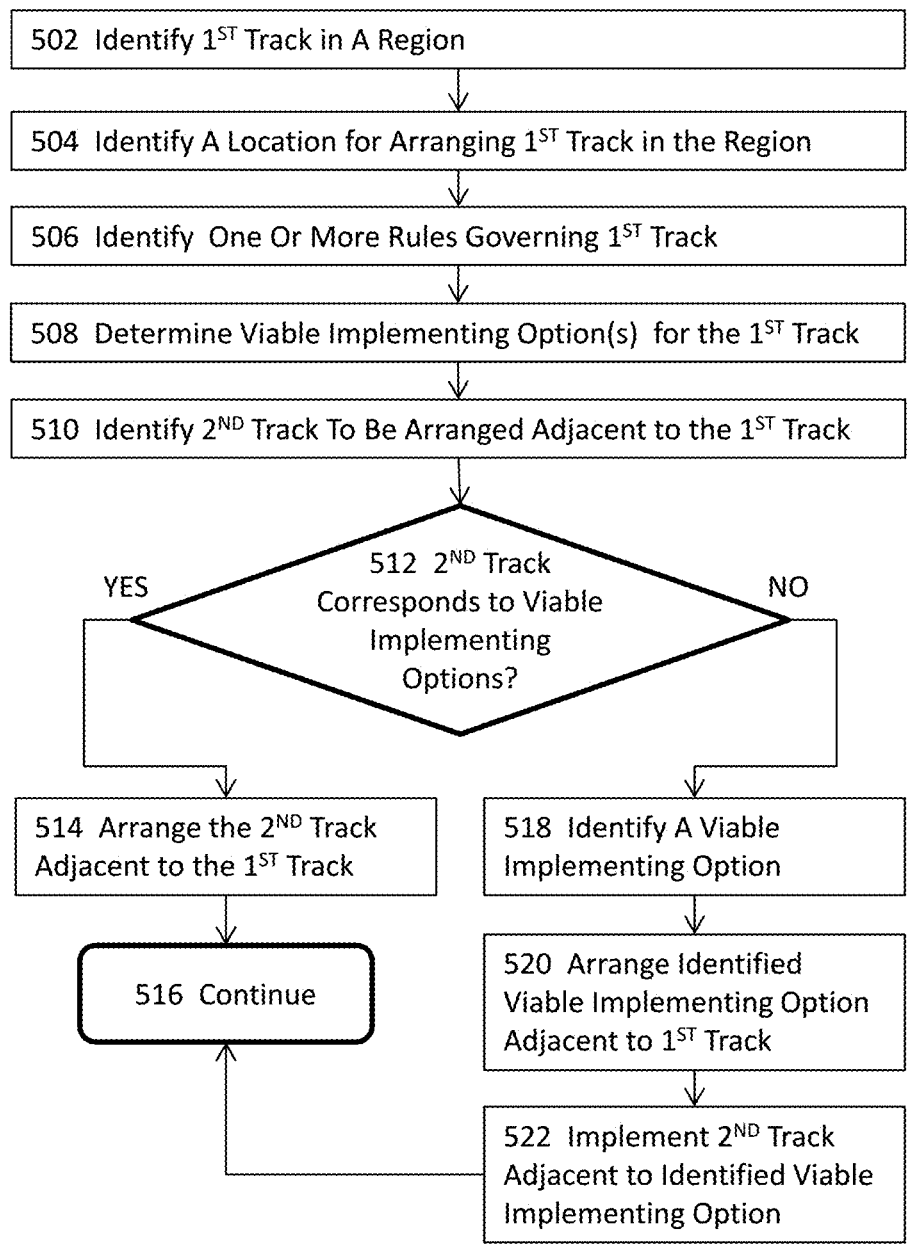
FIG. 5 illustrates another more detailed level flow diagram for a method or system for implementing track patterns for electronic circuit designs in some embodiments.

FIG. 5 illustrates another more detailed level flow diagram for a method or system for implementing track patterns for electronic circuit designs in some embodiments. In these embodiments illustrated in FIG. 5, the method or system may identify a first track in a region of an electronic design at 502 and identify a location for arranging the first track in the region at 504. As similarly described above with reference to FIG. 3, a region may include a cell, a block, an arbitrary area (e.g., a windowed area in a layout editor) in an electronic design, or an instance thereof. The location may be identified in a variety of ways.

For example, the method or system may receive a user's input for the exact coordinates of the location via a computer keyboard or for an approximate location on a display apparatus via a computer pointing device. At 506, the method or system may identify one or more design rules governing the first track. The one or more design rules include, for example but not limited to, a minimum spacing design rule governing the minimum spacing between two adjacent wires, design rules governing which tracks associate with associated with certain widths may be situated immediately adjacent to another track associated with a width (e.g., pair rules governing which two-width combinations are legal or triplet rule governing which three-width combinations are legal, etc.), one or more other design rules such as a minimum length rule governing the minimum length required for an interconnect segment, a same track line-end design rule, a different track line-end design rule, a keep-out design rule, etc.

Some of these design rules will be described in greater details in subsequent paragraphs with reference to FIGS. 8A-I below. At 508, the method or system may determine one or more viable implementing options for the first track identified at 502. In some of these embodiments illustrated in FIG. 5, the method or system may identify a viable implementing option for the first track by forward looking into at least a portion of the design such that the identified viable implementing option may result in more or the most number of subsequent viable options at 508. The method or system may identify a second track that is to be arranged adjacent to the first track at 510. At 512, the method or system determines whether or not the identified second track belongs to the one or more viable implementing options identified at 508.

If the determination result at 512 is affirmative, the method or system may proceed to 514 to add the second track to the track pattern and arrange the second track immediately adjacent to the first track and further proceed to 516 to continue with the electronic design. On the other hand, if the determination result at 512 is negative, the method or system may identify a viable implementing option from the one or more viable implementing options for both the first track and the second track at 518 and arrange the identified viable implementing option immediately adjacent to the first track in the track pattern at 520.

In some of the illustrative embodiments, the method or system may identify the viable implementing option for the first track at 518 by forward looking into at least a portion of the design or the track pattern such that the identified viable implementing option may result in more or the most number of subsequent viable options for the track pattern implementation. The method may then proceed to 522 to further arrange the second track immediately adjacent to the viable implementing option identified at 518 to add the second track to the track pattern. In these embodiments, the track pattern now includes three tracks—the first track, the viable implementing option identified at 518, and the second track. The viable implementing option identified at 518 may serve as a dummy track for possible future use as, for example, a track for interconnection or a dummy pin interconnected with an actual pin.

Figure 6:
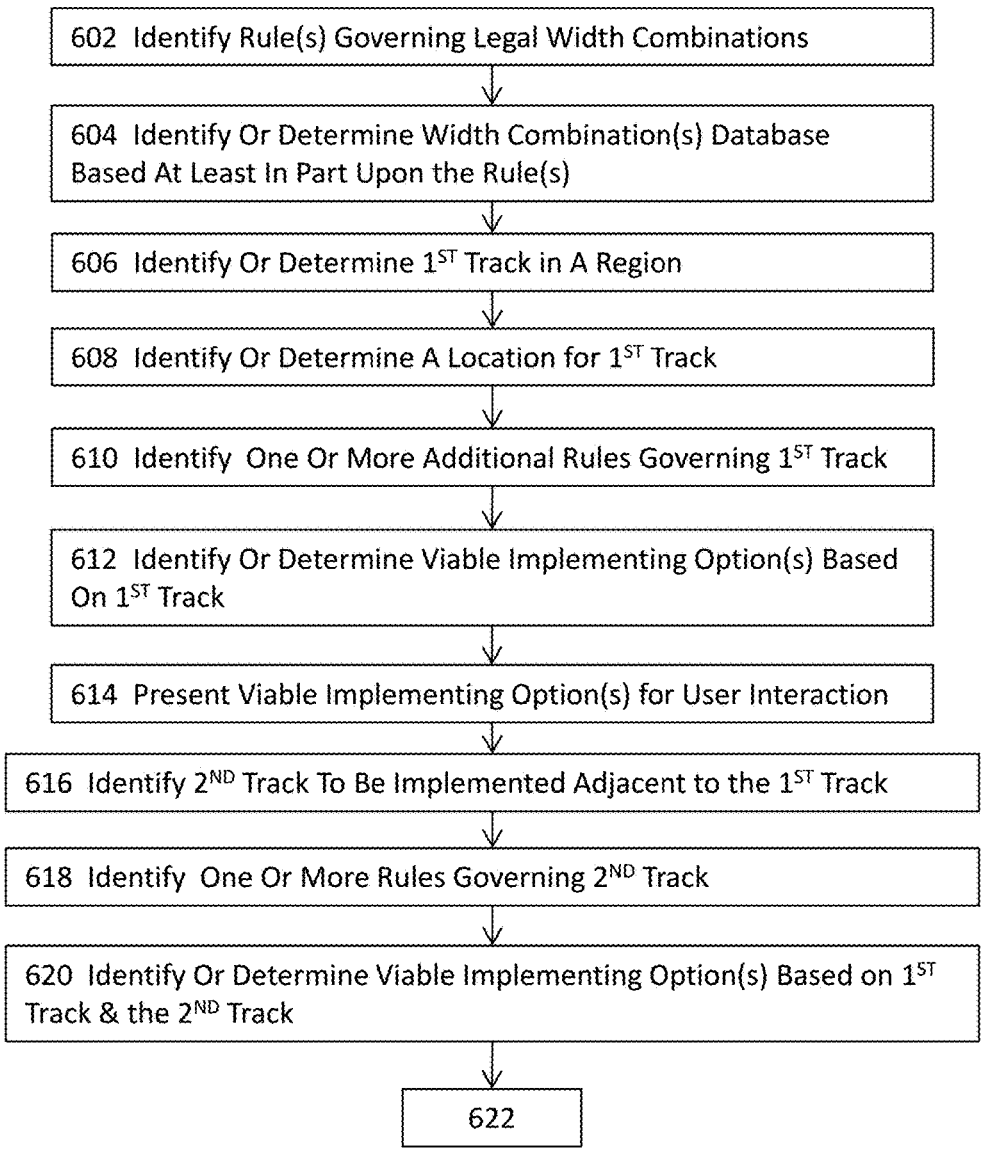
FIGS. 6 and 6A illustrates another more detailed level flow diagram for a method or system for implementing track patterns for electronic circuit designs in some embodiments.
Figure 6A:
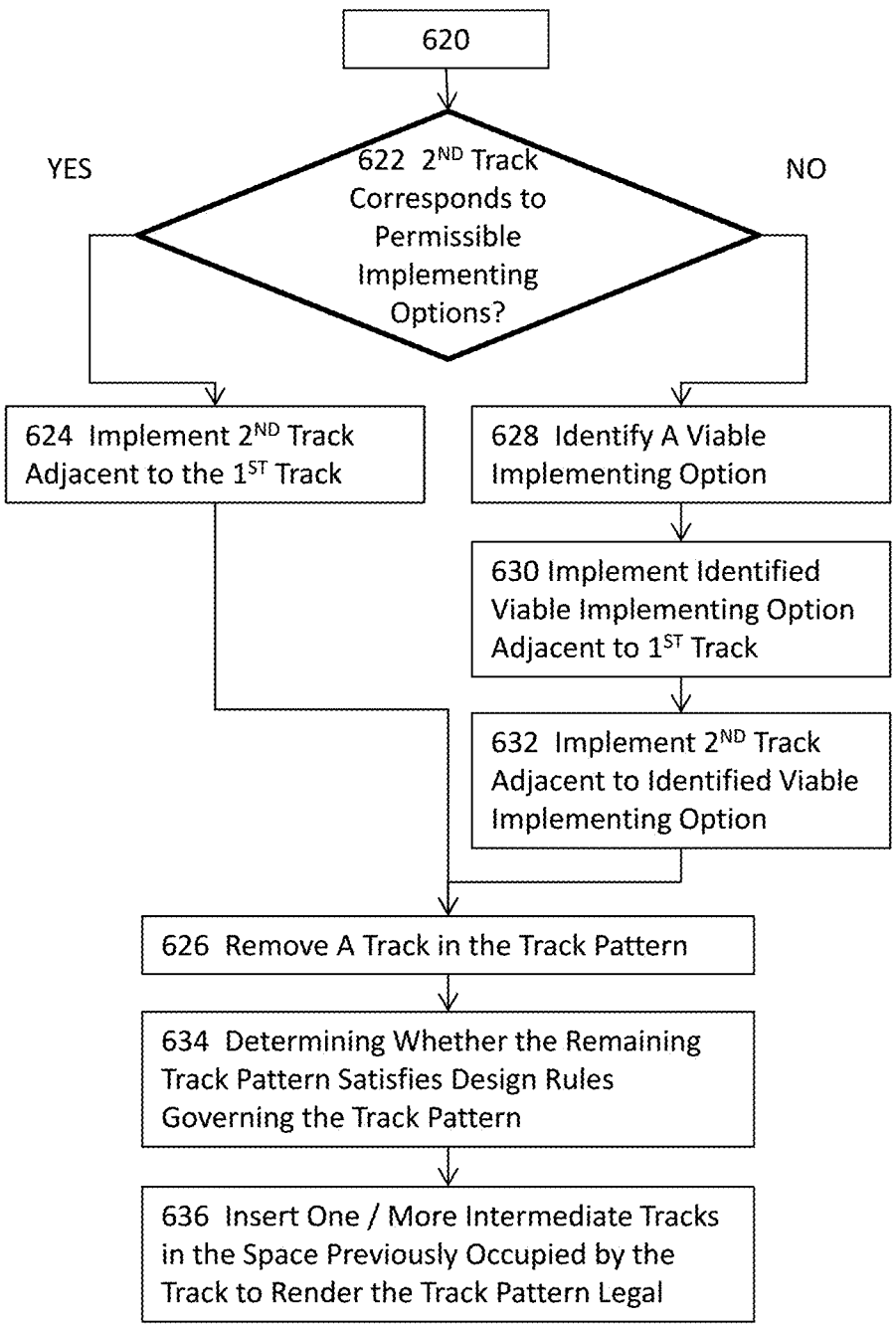

FIGS. 6 and 6A jointly illustrate another more detailed level flow diagram for a method or system for implementing track patterns for electronic circuit designs in some embodiments. In these embodiments illustrated in FIG. 5, the method or system may identify one or more design rules that govern legal combinations of various widths in track patterns at 602.

The one or more design rules include, for example but not limited to, a minimum spacing design rule governing the minimum spacing between two adjacent wires, design rules governing which tracks associate with associated with certain widths may be situated immediately adjacent to another track associated with a width (e.g., pair rules governing which two-width combinations are legal or triplet rule governing which three-width combinations are legal, etc.), one or more other design rules such as a minimum length rule governing the minimum length required for an interconnect segment, a same track line-end design rule, a different track line-end design rule, a keep-out design rule, etc. Some of these design rules will be described in greater details in subsequent paragraphs with reference to FIGS. 8A-I below.

At 604, the method or system may identify or determine a database including legal combinations of widths associated with respective tracks based at least in part upon the one or more design rules identified at 602. A first track in the region may be identified at 606, and a location for arranging the first track in a track pattern may be identified or determined at 608. The method or system may identify the first track by dynamically presenting legal width options to the designer as shown in FIGS. 11 and 11A and identifying the designer's selection of a legal width from the presented legal width options or viable implementing options.

In some embodiments, the legal width options or one or more viable implementing options are presented to a user in response to a user's action (e.g., selecting or identifying one viable implementing option) in a dynamic and substantially real-time manner. Nonetheless, it shall be noted that the manipulation may trigger one or more processes or may invoke one or more modules to perform various functions in order to generate the response to the manipulation, and that the triggering of the one or more processes or the invocation of various modules may take certain time to complete. As a result, the display of the response occurs substantially in real-time.

Figure 11:
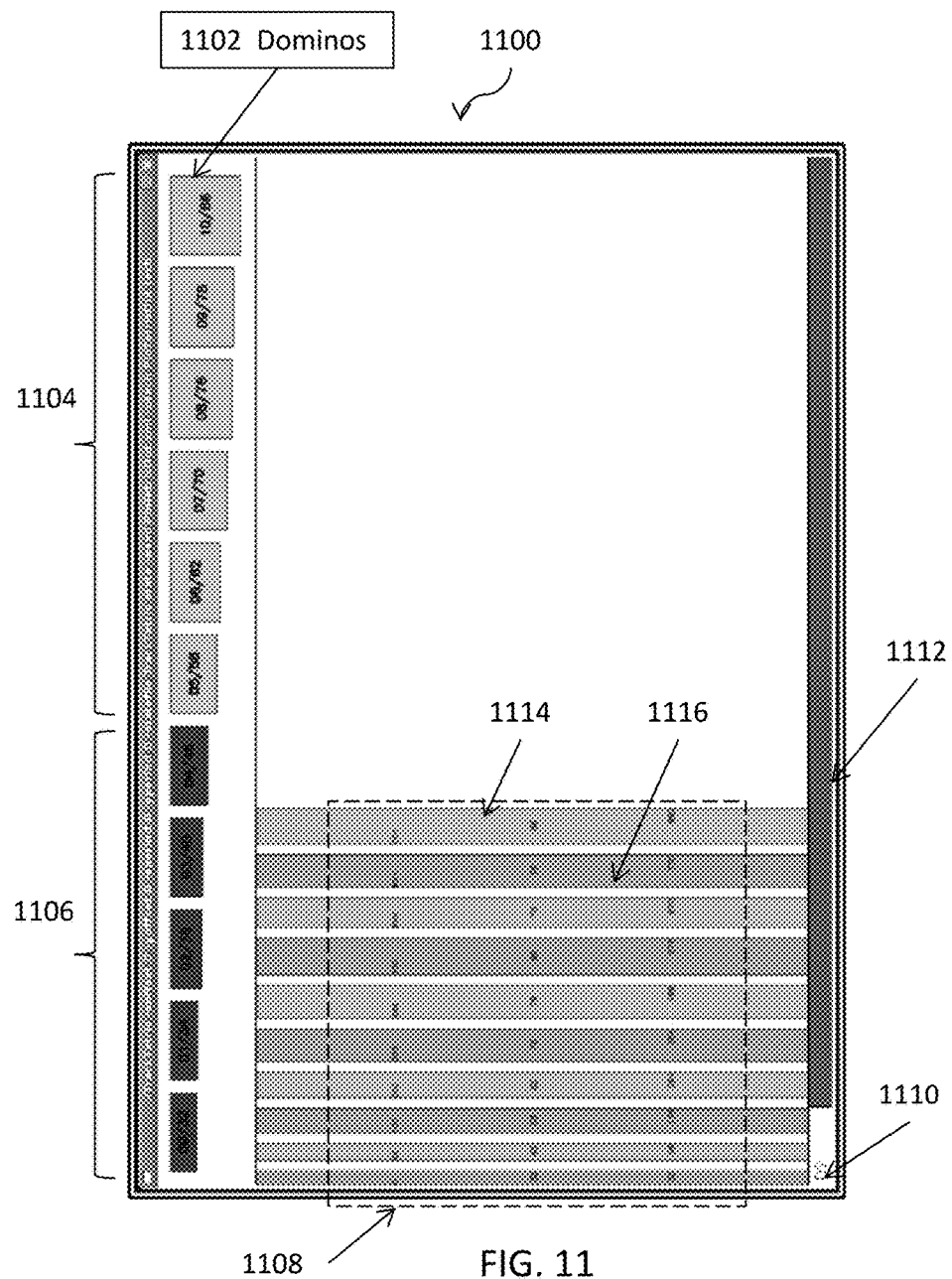
FIG. 11 illustrates an illustrative a portion of a window of an electronic design automation tool for implementing track patterns for electronic circuit designs in some embodiments.
Figure 11A:
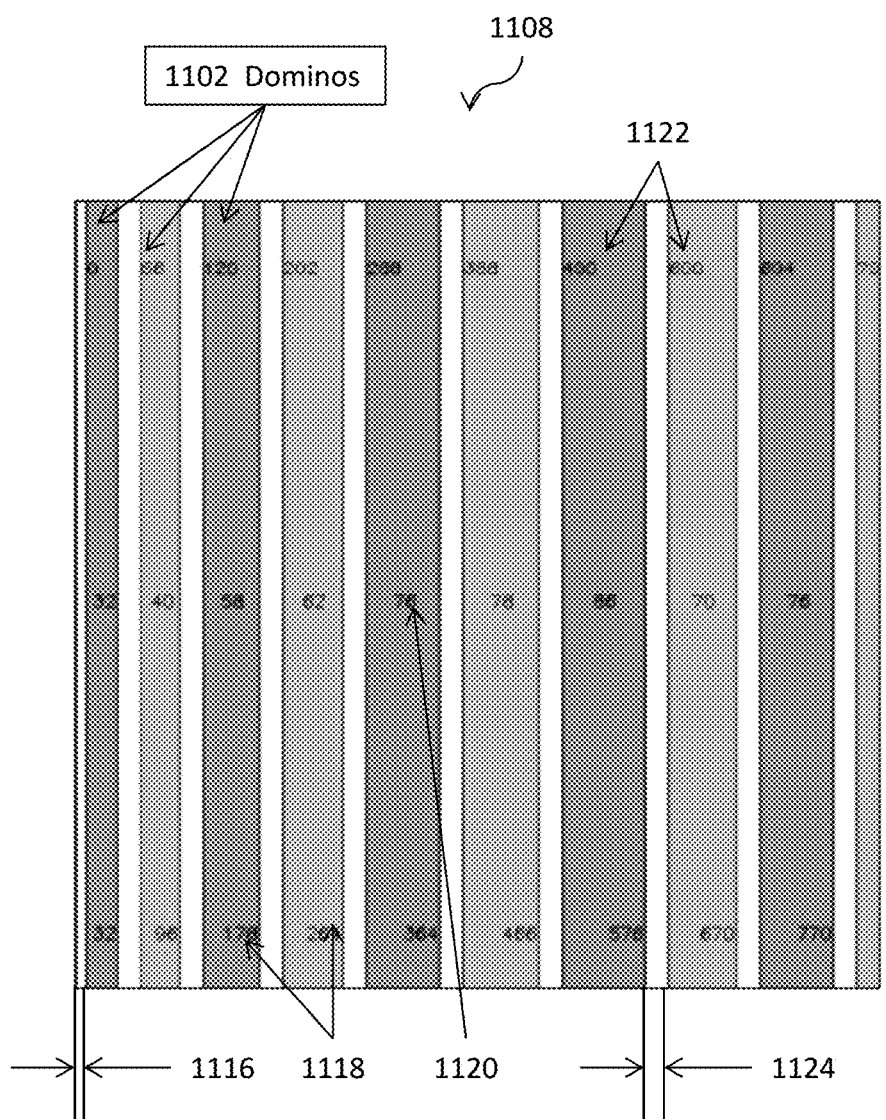
FIG. 11A illustrates an illustrative a portion of a window of an electronic design automation tool for implementing track patterns for electronic circuit designs in some embodiments.
Figure 12:
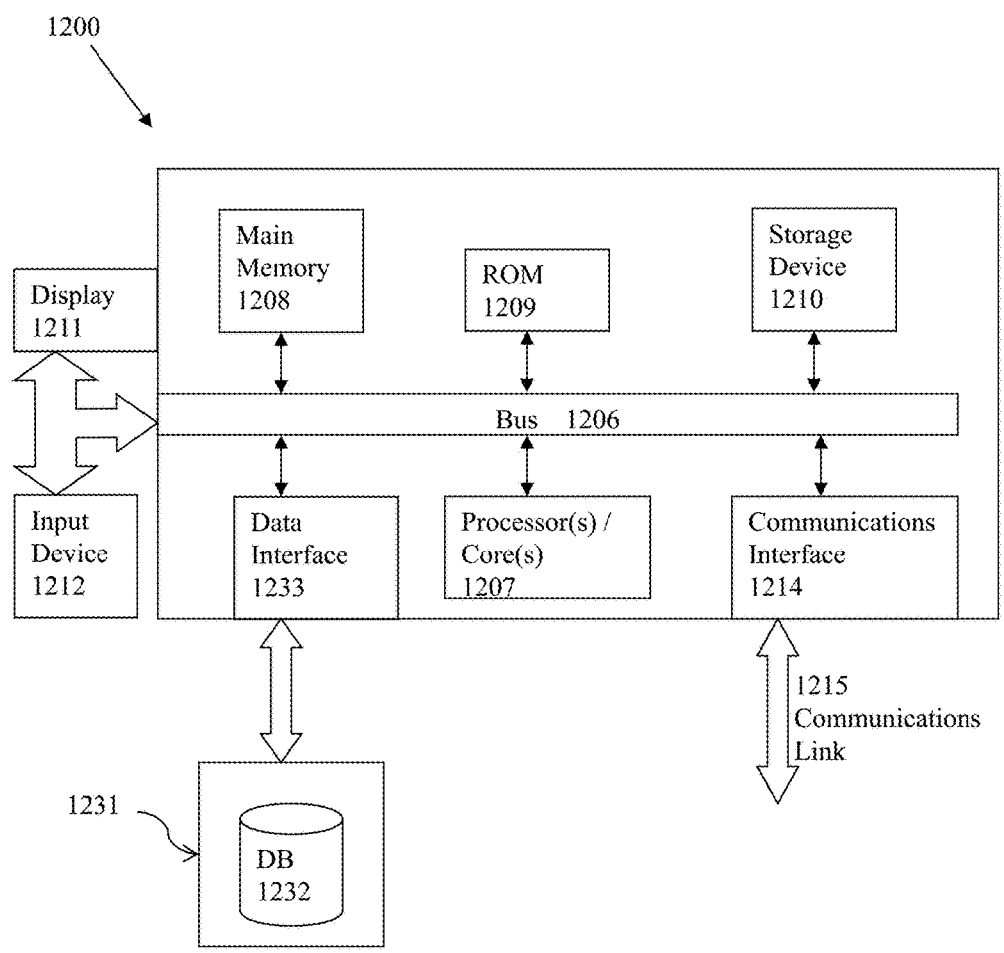
FIG. 12 illustrates a computerized system on which a method for implementing track patterns for electronic circuit designs can be implemented.

For example, in FIG. 11, the widths 58, 62,70, 76, 78, and 86 illustrated in lighter shaded boxes may be presented as viable implementing options to a designer for the next track, and the designer may select a width therefrom by using, for example, a computing pointing device to indicate the width to be associated with the next track. The designer may simply click in an approximate location to indicate where the next track is to be inserted, and the method or system will automatically determine the location for the next track while satisfying the governing one or more design rules at 608.

In some embodiments where a constant spacing rule applies, the method or system may automatically determine the location for the next track while satisfying the governing one or more design rules after the method or system identifies the designer's identification of a viable implementing option from the presented list of viable implementing options. A constant spacing design rule requires that the corresponding edges facing each other of two separate wires must be maintained at a constant spacing value. At 610, the method or system may identify one or more additional design rules governing the first track. These one or more additional design rules may include, for example, one or more customer- or foundry-provided design rules or requirements for the track pattern.

For example, a customer may provide a partial, pre-seeded track pattern that includes a specific arrangement of a number of track, each of which associated with its respective width value. The method or system may thus identify the first track from such partial, pre-seeded track pattern at 610. At 612, the method or system may identify one or more viable implementing options based at least in part upon the first track. In some embodiments, the method or system may simply look up the one or more viable implementing options from the database that includes various legal combinations of widths for various tracks arranged in certain sequences.

In some embodiments, the method or system may identify the one or more viable implementing options by consulting the database or various matrices (e.g., the matrices graphically illustrated in FIGS. 10 and 10A) including various legal track patterns having various tracks associated with respective widths and arranged in various sequences. At 614, the method or system may further optionally present one or more viable implementing options to the user. In some embodiments, one or more viable implementing options that may give rise to more or the most number of subsequent viable implementing options may be presented to the user as the method or system may predict which viable implementing options may provide more subsequent viable implementing options based at least in part upon, for example, the track pattern or the partial, pre-seeded track pattern identified, a portion of the electronic design, one or more prior similar electronic designs, etc.

At 616, the method or system may identify a second track to be arranged or implemented adjacent to the first track in the track pattern and may further identify one or more design rules governing the second track at 618, if such one or more design rules have not been identified. For example, the track pattern at 618 now includes the first track, the method may further identify the pair rule governing which two-width combinations are legal. At 620, the method or system may identify or determine one or more viable implementing options based at least in part upon the first track, the second track, and one or more design rules identified at 618. In other words, the method or system is to determine the viable implementing options for one or more intermediate tracks to be arranged in a two-track track pattern between the first track and the second track.

In some embodiments, the method or system may identify these one or more viable implementing options by first identifying a first set of viable implementing options for the first track (e.g., those identified at 612) and a second set of viable implementing options for the second track based on the pair design rule. The method or system may then identify the set of viable implementing options for both the first track and the second track by taking the intersection of the first set and the second set in some embodiments. These one or more viable implementing options may be identified at 618 by, for example, examining the database identified or determined at 604 or various matrices such as those matrices graphically illustrated in FIGS. 10 and 10A.

The method or system may then determine whether the second track belongs to the one or more viable implementing options of the first track. If the determination result is affirmative, the method or system may then arrange the second track at or near the location identified or determined at 608 immediately adjacent to the first track at 624 and proceed to 606 to continue the design process. For example, the method or system may follow a similar approach to identify and associate a width with the third track that is to be arranged immediately adjacent to or with one or more intermediate tracks therebetween the second track in the track pattern.

On the other hand, if the determination result at 622 is negative, the method or system may then identify, at 628, a viable implementing option at 628 from the one or more viable implementing options identified or determined at 620. For example, if it is determined that arranging the second track immediately adjacent to the first track is prohibited by one or more design rules, the method or system may identify a viable implementing option from the one or more viable implementing options for both the first track and the second track identified at 620 and use this viable implementing option as an intermediate track to transition from the first track to the second track. At 630, the identified viable implementing option may be arranged immediately adjacent to the first track.

Because the viable implementing option belongs to the set of viable implementing options for both the first track and the second track, the track pattern now including the first track and the viable implementing option is thus legal. At 632, the method or system may then arrange or implement the second track immediately adjacent to the viable implementing option and form a three-track track pattern. Because the viable implementing option belongs to the set of viable implementing options for both the first track and the second track, the track pattern now including the first track, the viable implementing option, and the second is again legal, while complying with various design rules. At 626, the method or system may optionally remove a track from the track pattern.

The method or system may then determine whether or not the remaining track pattern satisfies various design rules governing the track pattern at 634. More specifically, the method or system determines whether the two tracks immediately adjacent to the track that is removed satisfies the pair or BC design rule at 634. That is, these two tracks now become immediately adjacent to each other due to the removal of the track therebetween. If it is determined that these two tracks do not satisfy these various design rules, the method or system may insert one or more intermediate tracks by using identical or substantially similar methodology described in the application to render the resulting track pattern legal at 636.

Figure 8A:
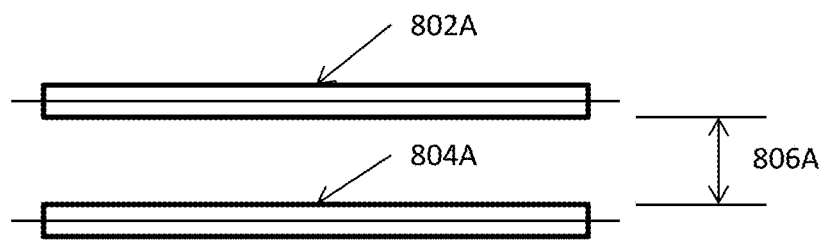
FIG. 8A illustrates a scenario where two wire segments and are spaced at a distance that is different from and thus violates the constant spacing rule in some embodiments.
Figures 1, 8A:
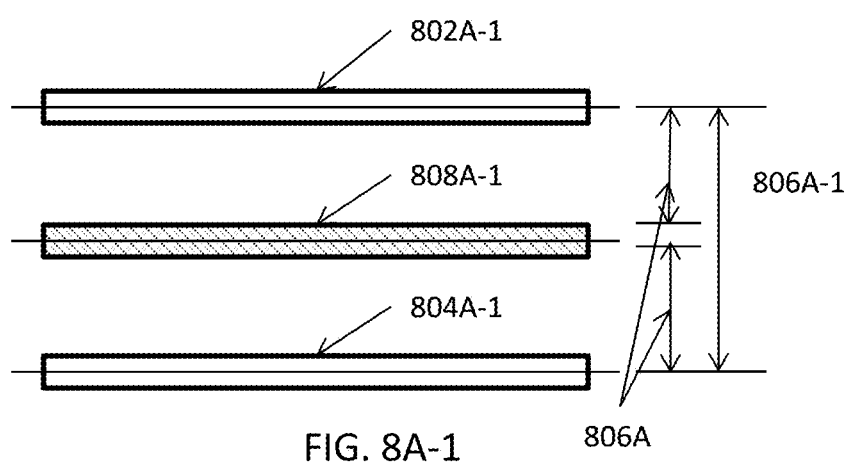
Figures 2, 8A:
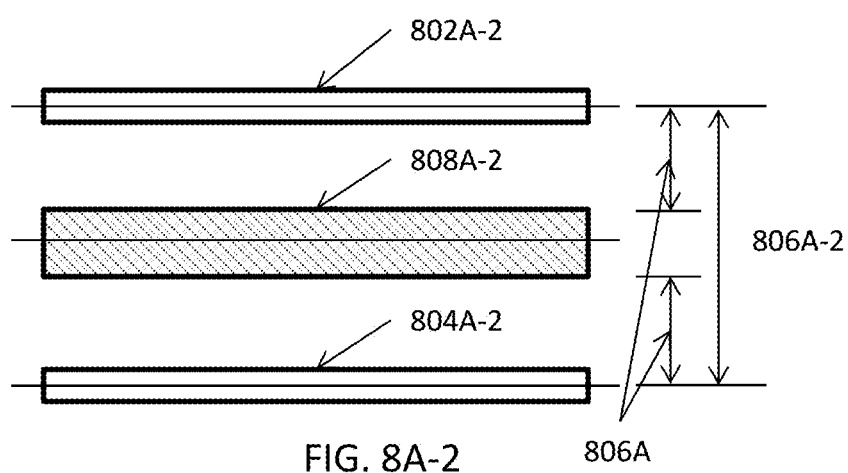

FIGS. 8A-I illustrates some illustrative design rules governing track patterns in electronic circuit designs in some embodiments. More specifically, FIG. 8A illustrates a constant spacing design rule that requires two wire segments 802A and 804A be spaced apart from each other at a constant spacing between corresponding edges of the wire segments as shown by the distance 806A in FIG. 8A. FIG. 8A-1 illustrates a scenario where two wire segments 802A-1 and 804A-1 are spaced at a distance 806A-1 that is different from and thus violates the constant spacing rule in some embodiments.

Various methods or systems may use techniques described herein to identify and insert another track 808A-1 between the first track 802A-1 and the second track 804A-1 to satisfy the constant spacing design rule. FIG. 8A-2 illustrates a scenario where two wire segments 802A-2 and 804A-2 are spaced at a distance 806A-2 that is different from and thus violates the constant spacing rule in some embodiments. Various methods or systems may use techniques described herein to identify and insert another track 808A-2 between the first track 802A-2 and the second track 804A-2 to satisfy the constant spacing design rule.

Figure 8B:
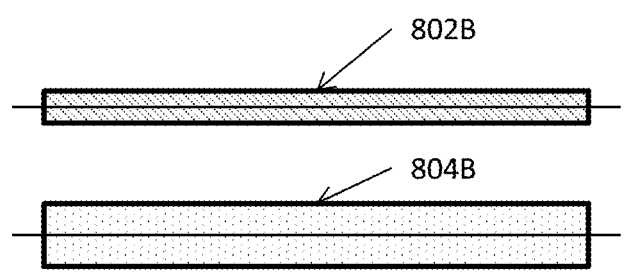
FIGS. 8B-I show some illustrative design rules governing track patterns in electronic circuit designs in some embodiments.

FIG. 8B illustrates a pair design rule which requires two adjacent wire segments 802B and 804B spaced at a certain distance be placed on two separate photo masks for manufacturing. Each wire segment is then associated with its respective photomask designation. This design rule may further govern what width combinations are legal. In other words, given a set of width values that may be used to implement wires in an electronic design, only a smaller subset of width combinations out of the set of all possible width combinations are considered legal.

Figure 8C:
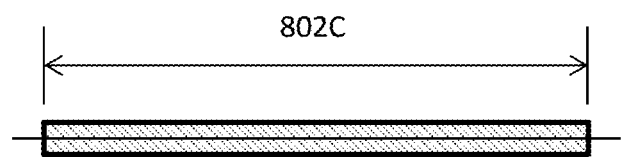
Figure 8D:
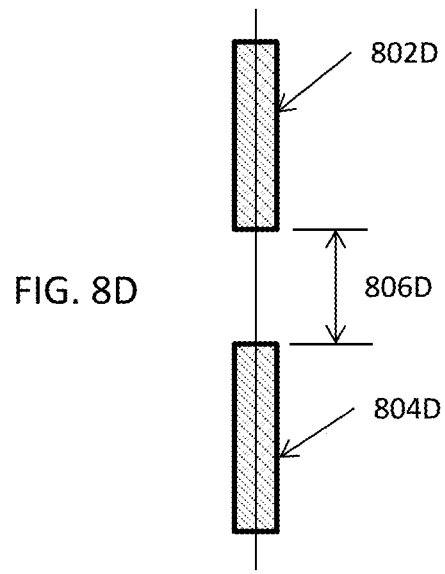

FIG. 8C illustrates a minimum length design rule that requires each wire segment in an electronic design to have at least the minimum required length in order to comply with this minimum length design rule. FIG. 8D illustrates the same track, same color line end spacing design rule which requires that the two facing line ends of two wire segments 802D and 804D along the same routing track and with the same photomask designation be spaced at a distance that is greater than or equal to a minimum line-end spacing value 806D.

Figure 8E:
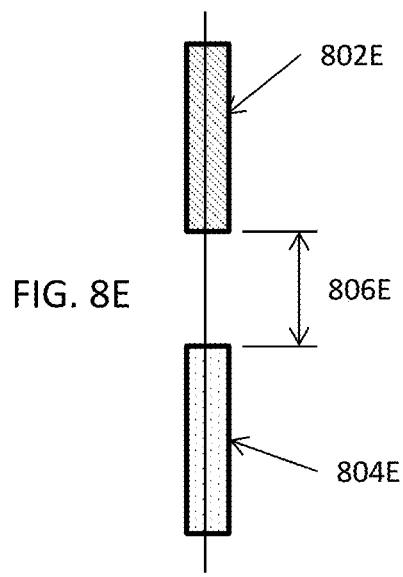
Figure 8F:
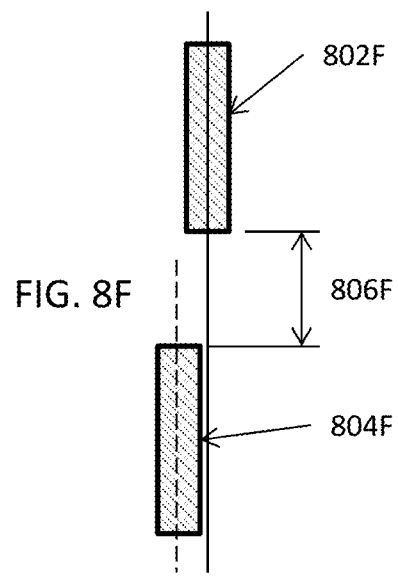

FIG. 8E illustrates the same track, different color line end spacing design rule which requires that the two facing line ends of two wire segments 802E and 804E along the same routing track but with different photomask designations be spaced at a distance that is greater than or equal to a minimum line-end spacing value 806E. FIG. 8F illustrates the different track, same color line end spacing design rule which requires that the two facing line ends of two wire segments 802F along the first track and 804F along the second routing track with same photomask designation be spaced at a distance that is greater than or equal to a minimum line-end spacing value 806F.

Figure 8G:
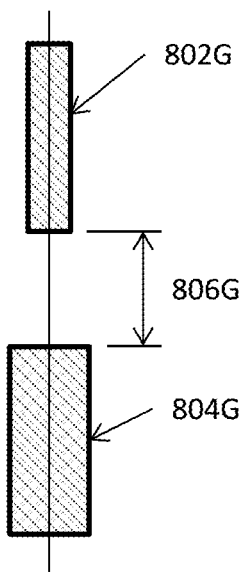
Figure 8H:
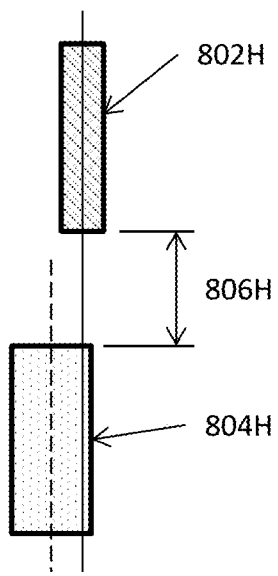

FIG. 8G illustrates the same track, same color, different width line end spacing design rule which requires that the two facing line ends of two wire segments 802G having a first width and 804G having a second width along the same routing track and with the same photomask designation be spaced at a distance that is greater than or equal to a minimum line-end spacing value 806G. FIG. 8H illustrates the different track, different color line end spacing design rule which requires that the two facing line ends of two wire segments 802H along the first track and 804H along the second routing track but with different photomask designation be spaced at a distance that is greater than or equal to a minimum line-end spacing value 806H.

Figure 8I:
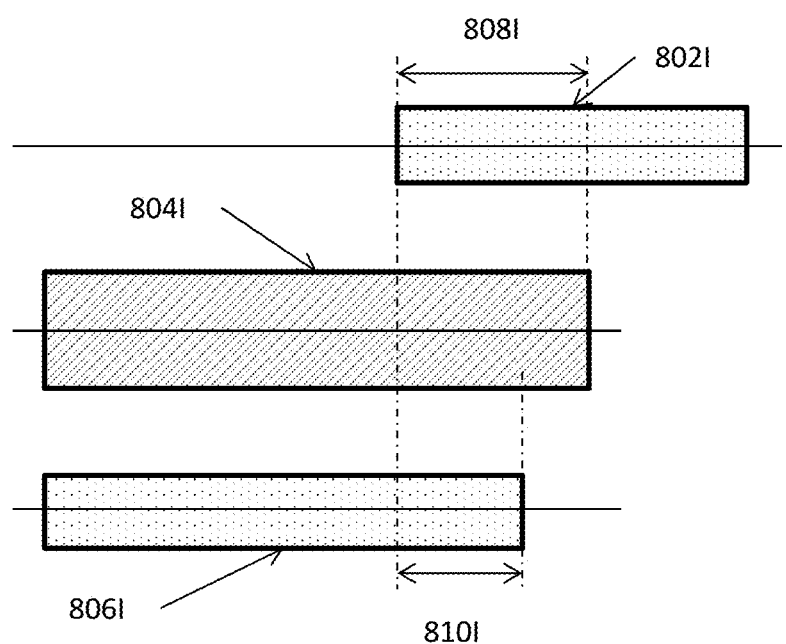

FIG. 8I illustrates a keep-out design rule. In FIG. 8H, the first wire segment 802I and the third wire segment 804I have the same photomask designation, and the second wire segment 804I has a different photomask designation. Each wire segment is associated with its respective width, and the three-track combination with three respective widths satisfies the triplet design rule. The keep-out rule requires that the overlapping line end of the first wire segment 802I is at a distance that is greater than or equal to the keep-out distance 808I from the overlapping line end of the second wire segment 804I. The keep-out rule also requires that the line end of the other adjacent wire segment 806I of the second wire segment 804I is at a distance that is greater than or equal to the "next neighbor keep-out" distance 810I from the overlapping line end of the second wire segment 804I. The "next neighbor keep-out" distance 810I may be dependent on the width of the second wire segment 804I in some embodiments.

Figure 9A:
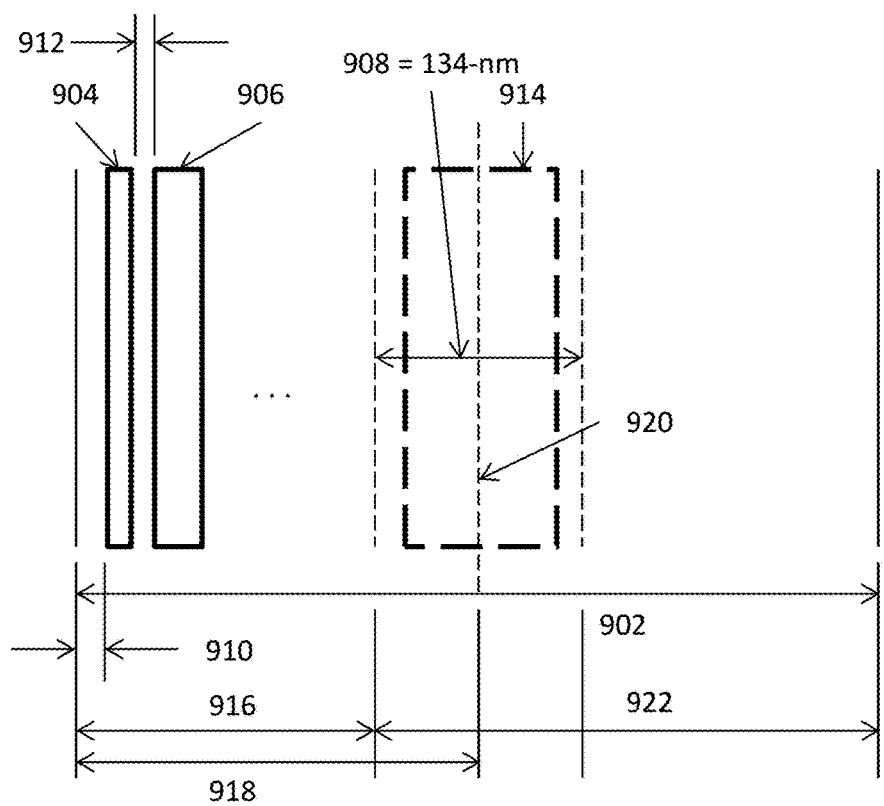
FIG. 9A illustrates a graphical representation demonstrating the enumeration techniques to determine legal track pattern database in some embodiments.

FIG. 9A illustrates a graphical representation demonstrating the enumeration techniques to determine legal track pattern database in some embodiments. More specifically, FIG. 9 illustrates an approach to obtain the legal track pattern database through induction and enumeration in some embodiments. In FIG. 9, the period 902 is generally bound by, for example, the size of a cell or cell instance. In this example, it is assumed that the period 902 is smaller than 1000-nm.

The constant spacing design rule also applies and requires two facing wire edges be spaced at a certain spacing value 912. In this example, it is assumed that the constant spacing value is 24-nm. The track pattern illustrated in FIG. 9 is assumed to have an offset 910 from the left boundary of the region. The offset 910 includes a non-negative integer. It is further assumed that the available widths belong to the set of $\{w_1=32, w_2=34, w_3=38, w_4=40, w_5=46, w_6=58, w_7=62, w_8=70, w_9=76, w_{10}=78, w_{11}=86\}$ for all wire segments in this region of the electronic design. Generally, the database includes track patterns that satisfies the following mathematical relation:

$$P(910)<=a_1\times(w_1+s)+a_2\times(w_2+s)+a_3\times(w_3+s)+\ldots \\ +a_{11}\times(w_{11}+s), \text{ wherein each } a_i \text{ is a non-negative integer.} \quad (1)$$

Given the eleven widths, the above mathematical relation represents a factorial mathematical problem whose solution is difficult to locate. Nonetheless, with the set of available widths given above, it is known that for a sub-area 908 having the width 134-nm, there must exist at least one track in the sub-area because 134-nm represents the track 914 with the widest width 86-nm) plus two constant spacing values—one on each side of the sub-area.

It shall be noted that the value 134-nm may be derived by the following mathematical relation: 134-nm=the max width 86-nm+2× (constant spacing value, 24-nm). Therefore, there must exist at least one track in the sub-area 908 when the sub-area 908 is positioned in the middle of the period 902. Therefore, the interval 916 may be determined by 1000−(134/2)=433-nm, and the interval 918 is determined by 1000/2=500-nm, where 920 represents the bisect of the sub-area 908.

The interval 922 is therefore determined by the relation 1000−433=567-nm. The above mathematical relation may thus be reduced to a simpler problem solving for the interval between 433-nm and 500-nm for each bifurcation. Therefore, the period (1000-nm in this example) in the above mathematical relation (1) may be reduced to 134 or even one-half of 134 or 67. This represents a much more solvable problem than the factorial problem illustrated in (1). The method may similarly solve for the next bifurcation until the entire period is solved for.

The method may thus determine the legal combinations of widths by performing a limited number of iterations, rather than solving the nearly NP-complete problem of mathematical relation (1). FIG. 9B illustrates various sizes of the combinatorial space with different number of widths in some embodiments. For example, if the only permitted width to be associated with various tracks is 32-nm, the combinatorial space is 17 with a constant spacing of 24-nm and an upper bound of the period of 1000-nm. That is, only 17 combinations of tracks are available within the period of 1000-nm. On the other hand, the combinatorial space grows to over $1.03\times10^{12}$ once all eleven widths are available for association with tracks. Manually determining which combinations are available thus becomes an insurmountable task.

FIG. 10 illustrates legal and illegal combinations of two adjacent tracks associated with two permitted widths in some embodiments. In this pattern illustrated in FIG. 10, each box along the vertical axis 1002 indicates a routing track or a track associated with a width for implementing a wire having the width. For example, the rows along axis 1002 may respectively represent selections of tracks associated with widths values of 32, 34, 38, 40, 46, 58, 62, 70, 76, 78, and 86 from the top. These tracks are to be implemented on a first photomask. Similarly, the columns along axis 1004 may also respectively represent selections of tracks associated with widths values of 32, 34, 38, 40, 46, 58, 62, 70, 76, 78, and 86 from the left. These tracks are to be implemented on a second photomask. The lighter shaded boxes 1006 indicate a legal combination of two adjacent tracks with a permitted width combination as governed by the design rules.

The darker shaded boxes 1008 an illegal combination of two adjacent tracks with a prohibited width combination as governed by the design rules. For example, the box at (2,3) (from the origin located at the upper left hand corner) indicates a track pattern having a first track associated with a 34-nm wire width (as indicated by the value 34 associated with the second column) on the first mask and a second track associated with a 38-nm wire width (as indicated by the value 38 associated with the third row) on the second mask. This lighter shaded pattern of the box (2, 3) indicates that the combination of (34-nm, 38-nm) wires will be permitted by the design rules.

Figure 10A:
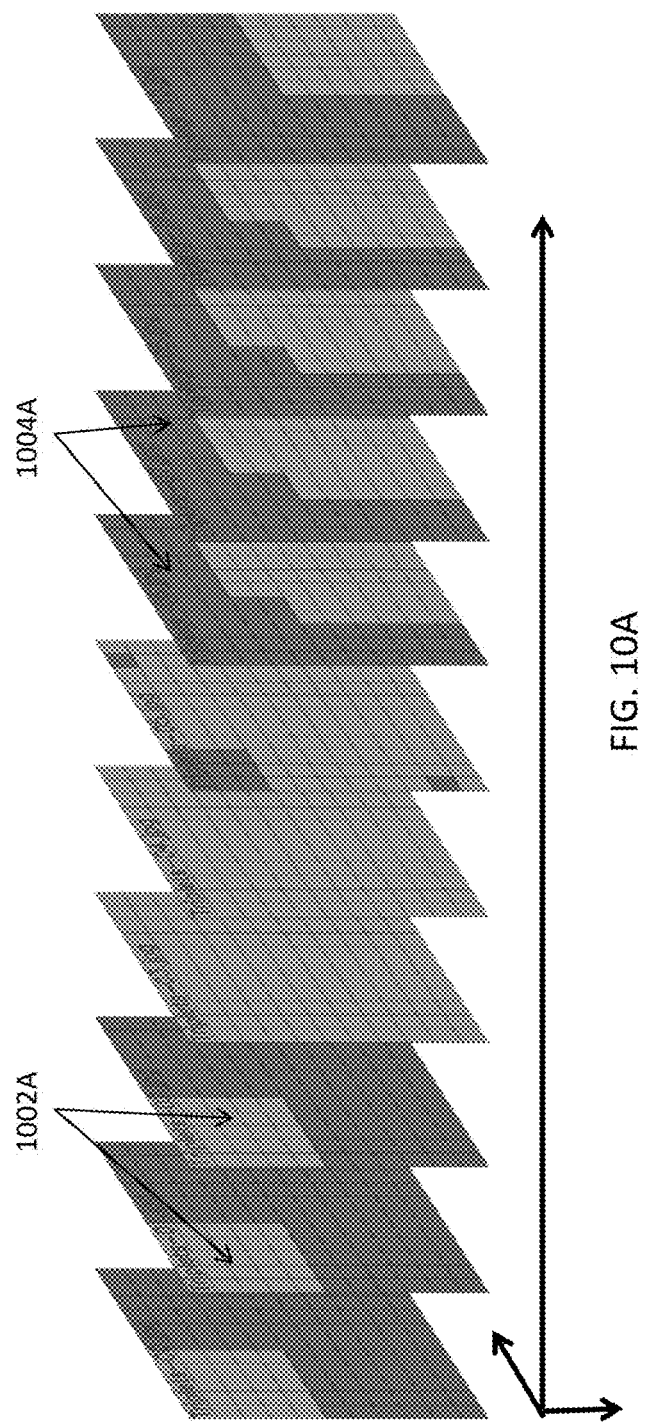
FIG. 10A illustrates legal and illegal combinations of three adjacent tracks associated with three permitted widths in some embodiments.

As another example, the box at (2, 6) indicates a track pattern having a first track associated with a 34-nm wire width on the first mask and a second track associated with a 58-nm wire width on the second mask. This darker shaded pattern of the box (2, 6) indicates that the combination of (34-nm, 58-nm) wires will be permitted by the design rules. In this pattern, there are 11 permitted wire widths, and each of the lighter shaded boxes indicates a legal, partial track pattern with two tracks. FIG. 10A illustrates legal and illegal combinations of three adjacent tracks associated with three permitted widths in some embodiments. As FIG. 10 shows, the illustrated design rules generally prohibit having a thin wire immediately neighboring a thick wire. The legal combinations of two tracks associated with permitted wire widths as shown in FIG. 10 are manageable and thus may be determined manually.

FIG. 10A further complicates the determination of legal combinations of three immediately neighboring tracks associated with permitted wire widths. As FIG. 10 shows, the addition of a track in a track pattern is governed and hence limited by the adjacent track. Therefore, the addition of the third track associated with a certain wire width is limited by the existing pair of tracks. As it can be seen from FIG. 10A, determining whether the addition of the third track associated with a certain wire width to an existing pair of tracks is legal is a more complex problem to be determined manually. Each "slice" in FIG. 10A illustrates the legal combinations as shown in lighter shaded boxes 1002A, given particular combinations of three tracks, each associated with a particular wire width as permitted by the design rules as given by the design rule manual (DRM).

Each "slice" in FIG. 10A also illustrates the illegal combinations as shown in darker shaded boxes 1004A, given particular combinations of three tracks, each associated with a particular wire width as permitted by the design rules. As it can be seen from FIG. 10A, determining legal combination of three tracks associated with respective wire widths is quite complex to be performed manually. A typical track pattern may easily include however, ten or more tracks spanning across a given track length which defines the width of a region in an electronic design. Determining the legal track patterns of ten or more adjacent tracks is nearly impossible to be performed manually.

FIGS. 11 and 11A illustrate an illustrative a portion of a window of an electronic design automation tool for implementing track patterns for electronic circuit designs in some embodiments. More specifically, the portion of an illustrative window 1100 showing an illustrative cell or block in FIG. 11 includes a number of dominos 1102, each of which may be labeled with a width value and an index indicating an identification of the domino. The number of dominos is divided into two groups as shown in FIG. 11 where the first group 1104 as indicated by the lighter shaded dominos indicates widths that may be selected for implementing the next track, and the second group 1106 as indicated by the darker shaded dominos indicates widths that may not be selected for implementing the next track in the track pattern.

FIG. 11 further shows that the portion of the window may also present messages to a user, and the currently selected domino 1110. 1114 indicates a track that corresponds to a first photomask as indicated by the lighter shades. 1116 indicates an adjacent track that corresponds to a second photomask as indicated by the darker shades. The area 1108 is further illustrated in FIG. 11A to show a finer view of the details in the area 1108.

As shown in FIG. 11, area 1108 includes some dominos 1102. 1116 indicates the offset of the first track from the left boundary of the cell or block. The offset may be a non-zero integer. The numbers 1118 indicate the respective left absolute or relative coordinates of the tracks, and the numbers 1120 represent the respective widths of the tracks. Similarly, the numbers 1122 represent the respective right absolute or relative coordinates of the tracks. Two immediately adjacent tracks are separated by a spacing value 1124 as governed by a spacing design rule or a constant spacing design rule.

SYSTEM ARCHITECTURE OVERVIEW

FIG. 14 illustrates a block diagram of an illustrative computing system 1400 suitable for implementing track pattern synthesis for electronic circuit designs as described in the preceding paragraphs with reference to various figures. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment, computer system 1400 performs specific operations by one or more processor or processor cores 1407 executing one or more sequences of one or more instructions contained in system memory 1408. Such instructions may be read into system memory 1408 from another computer readable/usable storage medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1407, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that includes a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing track pattern for electronic designs, comprising:
    identifying, by one or more track pattern processing modules stored at least partially in memory of and functioning in conjunction with at least one microprocessor of a computing system, a first track and a second track in a region that corresponds to a period distance within an electronic design, the second track to be arranged adjacent to the first track;
    reducing, by the one or more track pattern processing modules, a combinatorial space for determining permissible arrangements of tracks in the region into a reduced combinatorial space at least by:
        generating or updating a data structure comprising a plurality of elements based at least part upon one or more design rules; and
        indexing the data structure into an indexed data structure at least by associating an element of the plurality of elements in the data structure with at least one permissible width value for the tracks and at least one legality indicator indicative of legality of an arrangement of tracks that correspond to the at least one permissible width value;
    determining, by the one or more track pattern processing modules, whether the second track corresponds to one or more first viable implementing options at least by identifying the one or more first viable implementing options from the indexed data structure in the reduced combinatorial space using at least a first width value associated with the first track and the second width value associated with the second track;
    creating or updating a track pattern in the region with the first track and the second track based at least in part upon the one or more first viable implementing options, wherein the track pattern comprises a plurality of tracks whose legality depends on an arrangement of width values associated with the plurality of tracks; and
    causing manufacturing of a layout of the electronic design that pertains to the track pattern with a plurality of photomasks on multi-patterning manufacturing equipment.

2. The computer implemented method of claim 1, the process further comprising:
    determining a plurality of intervals based at least in part upon the period distance, the one or more design rules governing the legal track patterns, and one or more permissible widths for the tracks;
    identifying one or more design rules governing the track pattern; and
    identifying or determining the one or more first viable implementing options for the first track in the region based at least in part upon the one or more design rules.

3. The computer implemented method of claim 2, further comprising:
    identifying a location for the second track in the region; and
    arranging the second track at or near the location based at least in part upon at least one of the one or more design rules.

4. The computer implemented method of claim 1, further comprising:
    identifying or determining at least one first viable implementing option from the one or more first viable implementing options based at least in part upon the first track and the second track;
    inserting at least one first intermediate track immediately adjacent to the first track in the track pattern, where the second track is determined not to correspond to the one or more first viable implementing options for the first track; and
    updating the track pattern by inserting the second track immediately adjacent to the at least one first intermediate track.

5. The computer implemented method of claim 1, further comprising:
    identifying a third track to be arranged adjacent to the second track in the track pattern; and
    determining whether or not the third track corresponds to one or more second viable implementing options for a second set based at least in part upon one or more characteristics of the second track and/or the first track.

6. The computer implemented method of claim 5, the process further comprising:
    identifying or determining at least one second viable implementing option from the one or more second viable implementing options based at least in part upon the first track and the second track;
    inserting at least one second intermediate track immediately adjacent to the second track in the track pattern, where the third track is determined not to correspond to the one or more second viable implementing options for the second track; and
    updating the track pattern by inserting the third track immediately adjacent to the at least one second intermediate track.

7. The computer implemented method of claim 1, the process further comprising:
    determining whether or not wrong-way routing is permitted in the region of the electronic design;
    determining whether the second track is used to implement a wire segment in a wrong-way routing direction for an interconnect; and
    identifying one or more widths associated with one or more tracks or wire segments in a right-way routing direction for the interconnect.

8. The computer implemented method of claim 7, the process further comprising:

identifying or determining a candidate width for the
second track based at least in part upon the one or more
widths associated with the one or more tracks or wire
segments in the right-way routing direction;
identifying or determining a final width associated with
the second track based at least in part upon the candidate width and the one or more first viable implementing options; and
updating the track pattern in the region with at least the
final width associated with the second track.

9. The computer implemented method of claim 7, the
process further comprising at least one of:
determining whether the wire segment to be implemented
on the second track satisfies one or more via insertion
design rules; and
dynamically presenting at least some of the one or more
first viable implementing options to a user based at
least in part upon an action of the user.

10. The computer implemented method of claim 1, the
process further comprising:
removing a specific track from the track pattern;
determining whether a remaining track pattern of the track
pattern after removal of the specific track meets various
design rules governing the track pattern; and
rendering the remaining track pattern legal by inserting
one or more intermediate tracks in a space previously
occupied by at least the specific track.

11. A system for implementing track pattern for electronic
designs, comprising:
non-transitory computer accessible storage medium storing thereupon program code;
a computer system including at least one processor or
processor core and configured to execute a sequence of
instructions for the program code to:
identify, by one or more track pattern processing modules
stored at least partially in the memory of and functioning in conjunction with the at least one processor or
process core of a computing system, a first track and a
second track in a region that corresponds to a period
distance within an electronic design, the second track to
be arranged adjacent to the first track;
reduce, by the one or more track pattern processing
modules, a combinatorial space for determining permissible arrangements of tracks in the region into a
reduced combinatorial space at least by:
generating or updating a data structure comprising a
plurality of elements based at least part upon one or
more design rules; and
indexing the data structure into an indexed data structure at least by associating an element of the plurality
of elements in the data structure with at least one
permissible width value for the tracks and at least
one legality indicator indicative of legality of an
arrangement of tracks that correspond to the at least
one permissible width value;
determine, by the one or more track pattern processing
modules, whether the second track corresponds to one
or more first viable implementing options at least by
identifying the one or more first viable implementing
options from the indexed data structure in the reduced
combinatorial space using at least a first width value
associated with the first track and the second width
value associated with the second track;
create or update a track pattern in the region with the first
track and the second track based at least in part upon
the one or more first viable implementing options,
wherein the track pattern comprises a plurality of tracks
whose legality depends on an arrangement of width
values associated with the plurality of tracks; and
cause manufacturing of a layout of the electronic design
that pertains to the track pattern with a plurality of
photomasks on multi-patterning manufacturing equipment.

12. The system of claim 11, wherein the at least one
processor or processor core further executes the sequence of
instructions to:
determine a plurality of intervals based at least in part
upon the period distance, the one or more design rules
governing the legal track patterns, and one or more
permissible widths for the tracks;
identify one or more design rules governing the track
pattern; and
identify or determine the one or more first viable implementing options for the first track in the region based at
least in part upon the one or more design rules.

13. The system of claim 12, wherein the at least one
processor or processor core further executes the sequence of
instructions to:
identify a location for the second track in the region; and
arrange the second track at or near the location based at
least in part upon at least one of the one or more design
rules.

14. The system of claim 11, wherein the at least one
processor or processor core further executes the sequence of
instructions to:
identify or determine at least one first viable implementing option from the one or more first viable implementing options based at least in part upon the first track and
the second track;
insert at least one first intermediate track immediately
adjacent to the first track in the track pattern, where the
second track is determined not to correspond to the one
or more first viable implementing options for the first
track; and
update the track pattern by inserting the second track
immediately adjacent to the at least one first intermediate track.

15. The system of claim 11, wherein the at least one
processor or processor core further executes the sequence of
instructions to:
determine whether or not wrong-way routing is permitted
in the region of the electronic design;
determine whether the second track is used to implement
a wire segment in a wrong-way routing direction for an
interconnect; and
identify one or more widths associated with one or more
tracks or wire segments in a right-way routing direction
for the interconnect.

16. An article of manufacture comprising a non-transitory
computer accessible storage medium having stored thereupon a sequence of instructions which, when executed by at
least one customizable processor executing one or more
threads, causes the at least one customizable processor to
perform a set of acts for implementing track pattern for
electronic designs, the set of acts comprising:
identifying, by one or more track pattern processing
modules stored at least partially in memory of and
functioning in conjunction with at least one microprocessor of a computing system, a first track and a second
track in a region that corresponds to a period distance
within an electronic design, the second track to be
arranged adjacent to the first track;
reducing, by the one or more track pattern processing
modules, a combinatorial space for determining permissible arrangements of tracks in the region into a reduced combinatorial space at least by:
generating or updating a data structure comprising a plurality of elements based at least part upon one or more design rules; and
indexing the data structure into an indexed data structure at least by associating an element of the plurality of elements in the data structure with at least one permissible width value for the tracks and at least one legality indicator indicative of legality of an arrangement of tracks that correspond to the at least one permissible width value;
determining, by the one or more track pattern processing modules, whether the second track corresponds to one or more first viable implementing options at least by identifying the one or more first viable implementing options from the indexed data structure in the reduced combinatorial space using at least a first width value associated with the first track and the second width value associated with the second track;
creating or updating a track pattern in the region with the first track and the second track based at least in part upon the one or more first viable implementing options, wherein the track pattern comprises a plurality of tracks whose legality depends on an arrangement of width values associated with the plurality of tracks; and
causing manufacturing of a layout of the electronic design that pertains to the track pattern with a plurality of photomasks on multi-patterning manufacturing equipment.

17. The article of manufacture of claim 16, further comprising:
determining a plurality of intervals based at least in part upon the period distance, the one or more design rules governing the legal track patterns, and one or more permissible widths for the tracks;
identifying or determining at least one first viable implementing option from the one or more first viable implementing options based at least in part upon the first track and the second track;
inserting at least one first intermediate track immediately adjacent to the first track in the track pattern, where the second track is determined not to correspond to the one or more first viable implementing options for the first track; and
updating the track pattern by inserting the second track immediately adjacent to the at least one first intermediate track.

18. The article of manufacture of claim 16, the process further comprising:
determining whether or not wrong-way routing is permitted in the region of the electronic design;
determining whether the second track is used to implement a wire segment in a wrong-way routing direction for an interconnect; and
identifying one or more widths associated with one or more tracks or wire segments in a right-way routing direction for the interconnect.

19. The article of manufacture of claim 18, the process further comprising:
identifying or determining a candidate width for the second track based at least in part upon the one or more widths associated with the one or more tracks or wire segments in the right-way routing direction;
identifying or determining a final width associated with the second track based at least in part upon the candidate width and the one or more first viable implementing options;
updating the track pattern in the region with at least the final width associated with the second track;
determining whether the wire segment to be implemented on the second track satisfies one or more via insertion design rules; and
dynamically presenting at least some of the one or more first viable implementing options to a user based at least in part upon an action of the user.

20. The article of manufacture of claim 18, the process further comprising:
removing a specific track from the track pattern;
determining whether a remaining track pattern of the track pattern after removal of the specific track meets various design rules governing the track pattern; and
rendering the remaining track pattern legal by inserting one or more intermediate tracks in a space previously occupied by at least the specific track.

* * * * *